(12) United States Patent
Simsek-Ege et al.

(10) Patent No.: US 12,051,459 B2
(45) Date of Patent: Jul. 30, 2024

(54) WORD LINE DRIVERS FOR MULTIPLE-DIE MEMORY DEVICES

(71) Applicant: Micron Technology, Inc., Boise, ID (US)

(72) Inventors: Fatma Arzum Simsek-Ege, Boise, ID (US); Mingdong Cui, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 161 days.

(21) Appl. No.: 17/893,654

(22) Filed: Aug. 23, 2022

(65) Prior Publication Data
US 2024/0071467 A1 Feb. 29, 2024

(51) Int. Cl.
*G11C 16/10* (2006.01)
*G11C 11/408* (2006.01)
*H10B 80/00* (2023.01)

(52) U.S. Cl.
CPC ...... *G11C 11/4085* (2013.01); *G11C 11/4087* (2013.01); *H10B 80/00* (2023.02)

(58) Field of Classification Search
CPC ..................................... G11C 16/10
USPC ..................................... 365/185.25
See application file for complete search history.

(56) References Cited

U.S. PATENT DOCUMENTS 9,767,908 B2 * 9/2017 Bushnaq ............... G11C 16/10

* cited by examiner

*Primary Examiner* — Jason Lappas
(74) *Attorney, Agent, or Firm* — Holland & Hart LLP

(57) ABSTRACT

Methods, systems, and devices for word line drivers for multiple-die memory devices are described. A memory device may include a first semiconductor die associated with at least memory cells and corresponding access lines of the memory device, and a second semiconductor die associated with at least access line driver circuitry of the memory device. The second semiconductor die may be located in contact with or otherwise adjacent to the first semiconductor die, and electrical contacts may be formed to couple the access line driver circuitry of the second semiconductor die with the access line conductors of the first semiconductor die. For example, cavities may be formed through the second semiconductor die and at least a portion of the first semiconductor die, and the electrical contacts may be formed between the semiconductor dies at least in part from forming a conductive material in the cavities.

25 Claims, 9 Drawing Sheets

| | Material 225 | | Gate Oxide Material 250 |
| | Semiconductor Material 230 | | Conductive Material 255 |
| | Dielectric Material 245 | | Doped Region 260 |

Access a set of one or more memory cells of a first semiconductor die based at least in part on biasing a word line conductor of the first semiconductor die Activate a first channel of a first transistor of a second semiconductor die, the first channel electrically coupled between the word line conductor and a word line selection voltage source of the second semiconductor die Deactivate a second channel of a second transistor of the second semiconductor die, the second channel electrically coupled between the word line conductor and a word line deselection voltage source of the second semiconductor die

WORD LINE DRIVERS FOR MULTIPLE-DIE MEMORY DEVICES

FIELD OF TECHNOLOGY

The following relates to one or more systems for memory, including word line drivers for multiple-die memory devices.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIGS. 8 and 9 show flowcharts illustrating a method or methods that support word line drivers for multiple-die memory devices in accordance with examples as disclosed herein.

DETAILED DESCRIPTION

Figure 1:
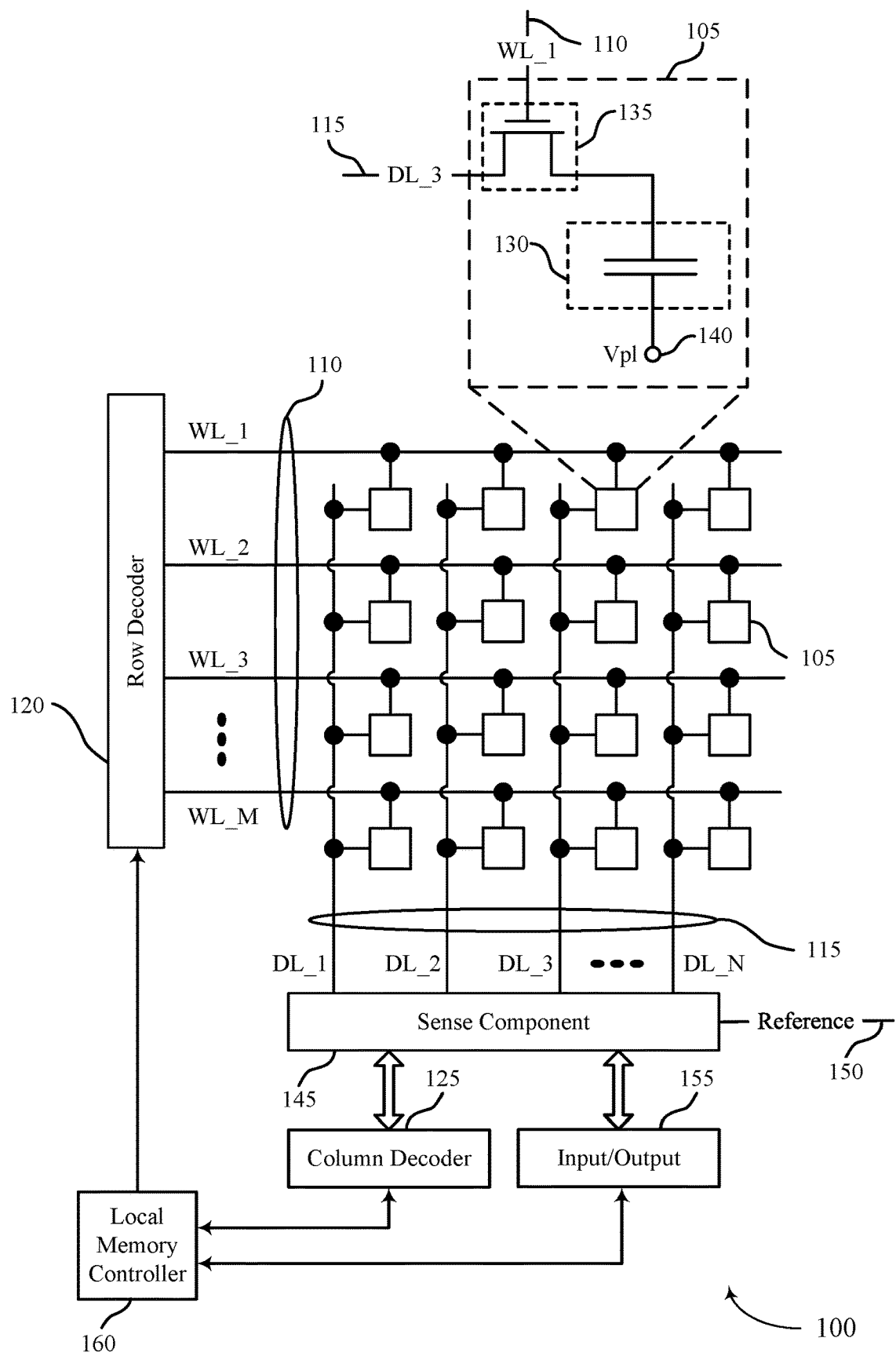
FIG. 1 illustrates an example of a memory architecture that supports word line drivers for multiple-die memory devices in accordance with examples as disclosed herein.

Memory devices may include various arrangements of memory cells and supporting circuitry formed over a substrate, such as a semiconductor substrate (e.g., a wafer of crystalline semiconductor, such as crystalline silicon). For example, a memory device may include one or more decks of memory cells over a substrate (e.g., of a memory die), where a deck may refer to a plane or level of memory cells above and parallel to the substrate. The one or more decks of memory cells may be associated with various arrangements of access line conductors, including access line conductors extending along one or more directions over a substrate, access line conductors along a direction from a substrate, or various combinations thereof. In some examples, circuitry for accessing the memory cells of a memory device (e.g., circuitry for selecting, accessing, or biasing access line conductors), such as driver circuitry, decoder circuitry, and other circuitry of the memory device may include transistors that are formed at least in part from doped portions of a substrate of a memory die (e.g., substrate-based transistors, transistors having channels formed from doped crystalline silicon or another semiconductor). However, as memory devices scale with a greater quantity of memory cells, (e.g., a greater density of memory cells over a memory die substrate, a greater quantity of layers or decks of memory cells above a memory die substrate), the area of a substrate of a memory die for circuitry to access the memory cells may increase, which may lead to various limitations (e.g., related to the limited area of a substrate to support a growing quantity of memory cells and, by extension, a growing quantity and area for such substrate-based circuitry).

In accordance with examples as disclosed herein, a memory device may include a first semiconductor die (e.g., including a first semiconductor substrate, a first memory die) associated with at least memory cells and corresponding access lines of the memory device, and a second semiconductor die (e.g., including a second semiconductor substrate, a second memory die) associated with at least access line driver circuitry of the memory device. The memory device may include various configurations of electrical contacts, formed in contact with at least a portion of the second semiconductor die and in contact with at least a portion of the first semiconductor die, that electrically couple the access line driver circuitry of the second semiconductor die with the access lines of the first semiconductor die. For example, the second semiconductor die may be located (e.g., placed, fixtured, attached, bonded) in contact with or otherwise adjacent to the first semiconductor die, and cavities may be formed through at least the second semiconductor die (e.g., through at least the substrate of the second semiconductor die) and at least expose a portion of the first semiconductor die. In some examples, such cavities may be coincident with respective conductors (e.g., landing pads, contact patches) of the second semiconductor die that are coupled with the access line drivers, and coincident with respective conductors of the first semiconductor die that are coupled with the access line conductors. The electrical contacts between the second semiconductor die and the first semiconductor die may be formed at least in part from forming (e.g., depositing) a conductive material in the cavities. In some other examples, electrical coupling between access line driver circuitry of the second semiconductor die and access lines of the first semiconductor die may additionally, or alternatively, be supported by other techniques, such as an electrical coupling between respective contacts of (e.g., at the surface of) the second semiconductor die, or the first semiconductor die, or both.

Implementing access line driver circuitry in a second semiconductor die, different than a first semiconductor die that is associated with the access lines and corresponding memory cells, may increase an area available for substrate-based circuitry (e.g., by implementing multiple substrates) compared to memory devices that include a single semiconductor die (e.g., a single semiconductor substrate, a single memory die). For example, such techniques may support leveraging substrate materials (e.g., crystalline semiconductor materials, crystalline silicon) for a greater quantity of components or larger components for circuitry such as the access line driver circuitry of the second semiconductor die, as well as other circuitry such as sensing circuitry, decoding circuitry, or periphery circuitry, among other circuitry used for accessing or otherwise operating memory cells of a memory device, which may be implemented on the first semiconductor die, on the second semiconductor die, or various combinations thereof. In some examples, implementing such circuitry in multiple levels of substrate-based circuitry of a memory device may alleviate or mitigate area utilization challenges or routing challenges of a single semiconductor substrate, which may improve scaling in memory devices by supporting a greater quantity of memory cells (e.g., a greater quantity of decks) for a given footprint, among other advantages.

Features of the disclosure are initially described in the context of a memory architecture as described with reference to FIG. 1. Features of the disclosure are described in the context of material arrangements, circuitry, and related manufacturing operations as described with reference to FIGS. 2A through 7. These and other features of the disclosure are further illustrated by and described with reference to flowcharts that relate to methods that support word line drivers for multiple-die memory devices as described with reference to FIGS. 8 and 9.

FIG. 1 illustrates an example of a memory architecture 100 that supports word line drivers for multiple-die memory devices in accordance with examples as disclosed herein. In some examples, the memory architecture 100 may be implemented as part of a memory chip, a memory device, or an electronic memory apparatus. The memory architecture 100 may include one or more memory cells 105 that may be programmable to store different logic states (e.g., programmed to one of a set of two or more possible states). For example, a memory cell 105 may be operable to store one bit of information at a time (e.g., a logic 0 or a logic 1). In some examples, a memory cell 105 (e.g., a multi-level memory cell) may be operable to store more than one bit of information at a time (e.g., a logic 00, logic 01, logic 10, a logic 11).

In some examples, a memory cell 105 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed (e.g., in a ferroelectric memory architecture). The memory cell 105 may include a logic storage component, such as capacitor 130, and a switching component 135 (e.g., a cell selection component). The capacitor 130 may be an example of a dielectric capacitor or a ferroelectric capacitor. A node of the capacitor 130 may be coupled with a voltage source 140, which may be the cell plate reference voltage, such as Vpl, or may be ground, such as Vss.

The memory architecture 100 may include access lines (e.g., word lines 110, digit lines 115) arranged in a pattern, such as a grid-like pattern. An access line may be a conductive line coupled with a memory cell 105 and may be used to perform access operations on the memory cell 105. In some examples, word lines 110 may be referred to as row lines. In some examples, digit lines 115 may be referred to as column lines or bit lines. References to access lines, row lines, column lines, word lines, digit lines, or bit lines, or their analogues, are interchangeable without loss of understanding, memory cells 105 may be positioned at intersections of the word lines 110 and the digit lines 115.

Operations such as reading and writing may be performed on the memory cells 105 by activating access lines such as a word line 110 or a digit line 115. By biasing a word line 110 and a digit line 115 (e.g., applying a voltage to the word line 110 or the digit line 115), a single memory cell 105 may be accessed at their intersection. The intersection of a word line 110 and a digit line 115 in a two-dimensional or in a three-dimensional configuration may be referred to as an address of a memory cell 105. Activating a word line 110 or a digit line 115 may include applying a voltage to the respective line.

Accessing the memory cells 105 may be controlled through a row decoder 120, or a column decoder 125, or any combination thereof. For example, a row decoder 120 may receive a row address from the local memory controller 160 and activate a word line 110 based on the received row address. A column decoder 125 may receive a column address from the local memory controller 160 and may activate a digit line 115 based on the received column address.

Selecting or deselecting the memory cell 105 may be accomplished by activating or deactivating the switching component 135 using a word line 110. The capacitor 130 may be coupled with the digit line 115 using the switching component 135. For example, the capacitor 130 may be isolated from digit line 115 when the switching component 135 is deactivated, and the capacitor 130 may be coupled with digit line 115 when the switching component 135 is activated.

A word line 110 may be a conductive line in electronic communication with a memory cell 105 that is used to perform access operations on the memory cell 105. In some architectures, the word line 110 may be coupled with a gate of a switching component 135 of a memory cell 105 and may be operable to control the switching component 135 of the memory cell. In some architectures, the word line 110 may be coupled with a node of the capacitor of the memory cell 105 and the memory cell 105 may not include a switching component.

A digit line 115 may be a conductive line that couples the memory cell 105 with a sense component 145. In some architectures, the memory cell 105 may be selectively coupled with the digit line 115 during portions of an access operation. For example, the word line 110 and the switching component 135 of the memory cell 105 may be operable to couple or isolate the capacitor 130 of the memory cell 105 and the digit line 115. In some architectures, the memory cell 105 may be coupled with the digit line 115.

The sense component 145 may be operable to detect a state (e.g., a charge) stored on the capacitor 130 of the memory cell 105 and determine a logic state of the memory cell 105 based on the stored state. The sense component 145 may include one or more sense amplifiers to amplify or otherwise convert a signal resulting from accessing the memory cell 105. The sense component 145 may compare a signal detected from the memory cell 105 to a reference 150 (e.g., a reference voltage). The detected logic state of the memory cell 105 may be provided as an output of the sense component 145 (e.g., to an input/output 155), and may indicate the detected logic state to another component of a memory device that includes the memory architecture 100.

The local memory controller 160 may control the accessing of memory cells 105 through the various components (e.g., row decoder 120, column decoder 125, sense component 145). In some examples, one or more of the row decoder 120, column decoder 125, and sense component 145 may be co-located with the local memory controller 160. The local memory controller 160 may be operable to receive one or more of commands or data from one or more different memory controllers (e.g., an external memory controller associated with a host device, another controller associated with the memory architecture 100), translate the commands or the data (or both) into information that can be used by the memory architecture 100, perform one or more operations on the memory architecture 100, and communicate data from the memory architecture 100 to a host (e.g., a host device) based on performing the one or more operations. The local memory controller 160 may generate row signals and column address signals to activate the target word line 110 and the target digit line 115. The local memory controller 160 also may generate and control various signals (e.g., voltages, currents) used during the operation of the memory architecture 100. In general, the amplitude, the shape, or the duration of an applied voltage or current discussed herein may be varied and may be different for the various operations discussed in operating the memory architecture 100.

The local memory controller 160 may be operable to perform one or more access operations on one or more memory cells 105 of the memory architecture 100. Examples of access operations may include a write operation, a read operation, a refresh operation, a precharge operation, or an activate operation, among others. In some examples, access operations may be performed by or otherwise coordinated by the local memory controller 160 in response to various access commands (e.g., from a host device). The local memory controller 160 may be operable to perform other access operations not listed here or other operations related to the operating of the memory architecture 100 that are not directly related to accessing the memory cells 105.

The local memory controller 160 may be operable to perform a write operation (e.g., a programming operation) on one or more memory cells 105 of the memory architecture 100. During a write operation, a memory cell 105 of the memory architecture 100 may be programmed to store a desired state (e.g., logic state, charge state). The local memory controller 160 may identify a target memory cell 105 on which to perform the write operation. The local memory controller 160 may identify a target word line 110 and a target digit line 115 coupled with the target memory cell 105 (e.g., an address of the target memory cell 105). The local memory controller 160 may activate the target word line 110 and the target digit line 115 (e.g., applying a voltage to the word line 110 or digit line 115) to access the target memory cell 105. The local memory controller 160 may apply a signal (e.g., a write pulse, a write voltage) to the digit line 115 during the write operation to store a specific state (e.g., charge) in the capacitor 130 of the memory cell 105. The signal used as part of the write operation may include one or more voltage levels over a duration.

The local memory controller 160 may be operable to perform a read operation (e.g., a sense operation) on one or more memory cells 105 of the memory architecture 100. During a read operation, the state (e.g., logic state, charge state) stored in a memory cell 105 of the memory architecture 100 may be evaluated (e.g., read, determined, identified). The local memory controller 160 may identify a target memory cell 105 on which to perform the read operation. The local memory controller 160 may identify a target word line 110 and a target digit line 115 coupled with the target memory cell 105 (e.g., the address of the target memory cell 105). The local memory controller 160 may activate the target word line 110 and the target digit line 115 (e.g., applying a voltage to the word line 110 or digit line 115) to access the target memory cell 105. The target memory cell 105 may transfer a signal (e.g., charge, voltage) to the sense component 145 in response to biasing the access lines. The sense component 145 may amplify the signal. The local memory controller 160 may activate the sense component 145 (e.g., latch the sense component) and compare the signal received from the memory cell 105 to a reference (e.g., the reference 150). Based on that comparison, the sense component 145 may determine a logic state that is stored on the memory cell 105.

Memory devices in accordance with the memory architecture 100 may include various arrangements of memory cells 105 and supporting circuitry formed over a substrate, such as a semiconductor substrate (e.g., a wafer of crystalline semiconductor, such as crystalline silicon). For example, a memory device may include one or more decks of memory cells 105 over a substrate (e.g., of a memory die), where a deck may refer to a plane or level of memory cells 105 above and parallel to the substrate. The one or more decks of memory cells 105 may be associated with various arrangements of access line conductors (e.g., conductor portions of a word line 110, conductor portions of a digit line 115), including access line conductors extending along one or more directions over a substrate, access line conductors along a direction from a substrate, or various combinations thereof. In some examples, circuitry for accessing the memory cells 105, such as circuitry of a row decoder 120, of a column decoder 125, of a sense component 145, of an input/output 155, of a local memory controller 160, may include transistors that are formed at least in part from doped portions of a substrate of a memory die (e.g., substrate-based transistors, transistors having channels formed from doped crystalline silicon or another semiconductor). However, as memory devices scale with a greater quantity of memory cells 105, (e.g., a greater density of memory cells over a memory die substrate, a greater quantity of layers or decks of memory cells above a memory die substrate), the area of a substrate of a memory die for circuitry to access the memory cells 105 may increase, which may lead to various limitations (e.g., related to the limited area of a substrate to support a growing quantity of memory cells and, by extension, a growing quantity and area for such substrate-based circuitry).

In accordance with examples as disclosed herein, a memory device may include a first semiconductor die (e.g., including a first semiconductor substrate, a first memory die) associated with at least memory cells 105 and corresponding access lines (e.g., word lines 110, digit lines 115) of the memory device, and a second semiconductor die (e.g., including a second semiconductor substrate, a second memory die) associated with at least a portion of access line driver circuitry of the memory device. The memory device may include various configurations of electrical contacts formed in contact with (e.g., coincident with, through) at least a portion of the first semiconductor die and at least a portion of the second semiconductor die that couple the access line driver circuitry of the second semiconductor die with the access lines of the first semiconductor die.

In some examples, a first semiconductor die may include word line conductors (e.g., at least a portion of word lines 110) that are each operable to access a respective set of one or more memory cells 105 (e.g., a row of memory cells) of the first semiconductor die. In some examples, the word line conductors of the first semiconductor die may be included in a two-dimensional arrangement along a first direction away from a substrate of the first semiconductor die and a second direction over the substrate of the first semiconductor die. In some examples, such an arrangement may include word line conductors having different extents along a third direction over the substrate of the first semiconductor die (e.g., in a staircase arrangement) to facilitate connections with electrical contacts formed between the semiconductor dies.

In some examples, a second semiconductor die may include word line drivers (e.g., at least a portion of a row decoder 120) that are each operable to access (e.g., select, bias, drive) a respective word line conductor of the first semiconductor die. In some examples, word line drivers of the second semiconductor die may be included in a two-dimensional arrangement along a first direction and a second direction over a substrate of the second semiconductor die (e.g., an in-plane arrangement along the substrate). Each word line driver may include a respective set of one or more transistors, one or more of which may be formed at least in part from doped portions (e.g., doped crystalline portions) of a substrate of the second semiconductor die.

In some implementations, the second semiconductor die may be located (e.g., placed, fixtured, attached, bonded) in contact with or otherwise adjacent to the first semiconductor die, and electrical contacts may be formed to couple the word line drivers of the second semiconductor die with the word line conductors of the first semiconductor die. For example, cavities may be formed coincident with (e.g., through at least a portion of, exposing at least a portion of) the second semiconductor die (e.g., through at least the substrate of the second semiconductor die) and at least a portion of the first semiconductor die, and the cavities may be coincident with respective conductors (e.g., landing pads, contact patches) of the second semiconductor die that are coupled with the word line drivers, and coincident with respective conductors of the first semiconductor die that are coupled with the word line conductors. The electrical contacts between the second semiconductor die and the first semiconductor die may be formed at least in part from forming (e.g., depositing) a conductive material in the cavities. In some other examples, electrical coupling between access line driver circuitry of the second semiconductor die and access lines of the first semiconductor die may additionally, or alternatively, be supported by other techniques, such as an electrical coupling between respective contacts of (e.g., at the surface of) the second semiconductor die, or the first semiconductor die, or both.

Implementing access line driver circuitry in a second semiconductor die, different than a first semiconductor die that is associated with the access lines and corresponding memory cells, may increase an area available for substrate-based circuitry (e.g., by implementing multiple substrates) compared to memory devices that include a single semiconductor die (e.g., a single semiconductor substrate, a single memory die). For example, such techniques may support leveraging substrate materials (e.g., crystalline semiconductor materials, crystalline silicon) for a greater quantity of components or larger components for circuitry such as the access line driver circuitry of the second semiconductor die, as well as other circuitry, such as other circuitry of a row decoder 120 (e.g., where applicable), of a column decoder 125, of a sense component 145, of an input/output 155, or of a local memory controller 160, which may be implemented on the first semiconductor die, on the second semiconductor die, or various combinations thereof. In some examples, implementing such circuitry in multiple levels of substrate-based circuitry of a memory device may alleviate or mitigate area utilization challenges or routing challenges of a single semiconductor substrate, which may improve scaling of the memory architecture 100 by supporting a greater quantity of memory cells 105 (e.g., a greater quantity of decks) for a given footprint, among other advantages.

FIGS. 2A-3 and 5-7 illustrate examples of material arrangements that support word line drivers for multiple-die memory devices in accordance with examples as disclosed herein. For example, FIGS. 2A-3 and 5-7 may illustrate aspects of operations for fabricating aspects of a material arrangement 200, a material arrangement 300, a material arrangement 500, a material arrangement 600, and a material arrangement 700, which each may illustrate one or more arrangements of materials over a substrate (e.g., a semiconductor substrate, a semiconductor wafer, a crystalline semiconductor, a substrate of a semiconductor die, a substrate of a memory die). Each of the material arrangements 200, 300, 500, 600, and 700 may be described with reference to an x-direction (e.g., a direction over the substrate, such as parallel to the substrate), a y-direction (e.g., another direction over the substrate, such as parallel to the substrate, which may be perpendicular or otherwise skewed relative to the x-direction), and a z-direction (e.g., a direction away from the substrate, such as a height direction or a thickness direction relative to the substrate, which may be perpendicular to an xy-plane or skewed relative to a direction perpendicular to an xy-plane), as illustrated. In some examples, each of the material arrangements 200, 300, 500, 600, and 700 may be a representation of a portion of a memory architecture 100 as described with reference to FIG. 1. Although each of the material arrangements 200, 300, 500, 600, and 700 illustrate examples of some relative dimensions and quantities of various features, aspects of each respective material arrangement may be implemented with other relative dimensions or quantities of such features in accordance with examples as described herein. In some cases, a view of a material arrangement may show structures that are beneath other structures. By making some upper layers transparent, some details may be viewed, which may illustrate examples of relative positions of elements and features.

Operations illustrated in and described with reference to FIGS. 2A-3 and 5-7 may be performed by a manufacturing system, such as a semiconductor fabrication system configured to perform additive operations (e.g., depositing, epitaxy, bonding), subtractive operations (e.g., etching, trenching, planarizing, polishing), modifying operations (e.g., oxidizing, doping, reacting, converting), and supporting operations (e.g., masking, patterning, photolithography, aligning, bonding), among other operations of formation that support the described techniques. In some cases, operations performed by such a manufacturing system may be supported by a process controller or its components as described herein.

Figure 2A:
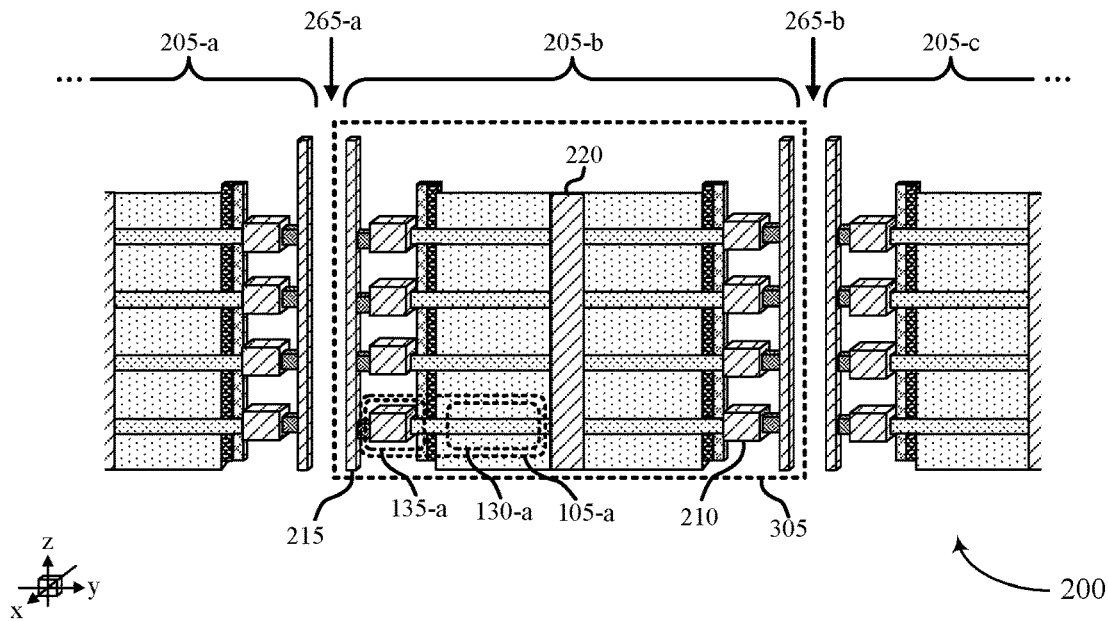
FIGS. 2A, 2B, and 3 illustrate examples of material arrangements that support word line drivers for multiple-die memory devices in accordance with examples as disclosed herein.
Figure 2B:
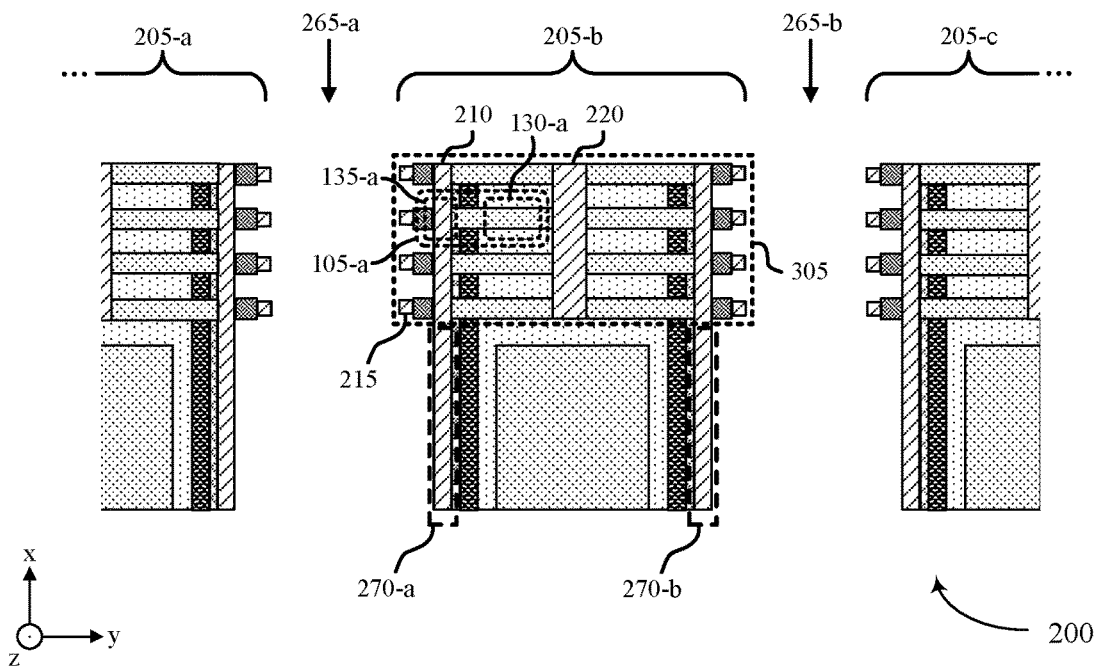

FIGS. 2A and 2B illustrate a material arrangement 200 that supports word line drivers for multiple-die memory devices in accordance with examples as disclosed herein. For example, FIG. 2A illustrates a cross-section of a portion of the material arrangement 200 in a yz-plane and FIG. 2B illustrates a cross-section of a portion of the material arrangement 200 in an xy-plane. The material arrangement 200 illustrates an example of features that may be formed in a first semiconductor die (e.g., including an array of memory cells 105 and associated access line conductors), at least a portion of which may be formed separately from a second semiconductor die that includes access line driver circuitry operable to bias access line conductors of the first semiconductor die.

Aspects of the material arrangement 200 may be described with reference to regions 205. Each region 205 may include a respective memory array 280. Each memory array 280 may include a three-dimensional array of memory cells 105 (e.g., memory cell 105-a), and each memory cell 105 may include a respective capacitor 130 (e.g., capacitor 130-a, a capacitance between electrical nodes that is supported by formed material portions) and a respective switching component 135 (e.g., switching component 135-a, a material portion operable to couple the capacitor 130-a with a access line, such as a digit line 115). Each region 205 also may include a set of word line conductors 210, each of which may be a portion of a word line 110, and a set of digit line conductors 215, each of which may be a portion of a digit line 115.

Each region 205 may also include a plate conductor 220, which may be an example of a plate node of the material arrangement 200 that is coupled with a plate voltage source, such as a voltage source 140. In the example of material arrangement 200, each word line conductor 210 may extend along the x-direction, and a set of multiple word line conductors 210 (e.g., a stack of word line conductors 210) may be arranged along the z-direction, such that each word line conductor 210 of a stack is associated with a location and an extent (e.g., a thickness) along the z-direction. The example of material arrangement 200 illustrates an example in which each region 205 includes a stack of word line conductors 210 on both sides (e.g., along the y-direction) of a plate conductor 220 but, in some other examples, a material arrangement in accordance with the disclosed techniques may include a stack of word line conductors 210 on a single side of a plate conductor 220, among other configurations. In the example of material arrangement 200, each digit line conductor 215 may extend along the z-direction, and a set of multiple digit line conductors 215 may be arranged along the x-direction. Each word line conductor 210 may be operable to couple a respective capacitor 130 with each digit line conductor 215 of a set of one or more digit line conductors along the x-direction.

The regions 205 may be separated from one another by isolation regions 265 (e.g., a trench, a trench isolation region), which may include one or more dielectric materials (not shown) that support an electrical isolation between at least portions of the regions 205. In the example of the material arrangement 200, the regions 205-a and 205-c may include features similar or identical to the region 205-b, but are truncated for illustrative purposes. In some cases, one or more isolation regions 265 (e.g., an isolation region 265-a and an isolation region 265-b) may extend along the z-direction, but other isolation regions may extend along other directions, such as around a perimeter of a region 205 or at least partially enclosing a volume of a region 205.

The material arrangement 200 may be an example of a portion of a semiconductor die after a set of one or more manufacturing operations. For example, forming the material arrangement 200 may include forming a stack (e.g., extending along the z-direction) of (e.g., including) alternating layers of a material 225 and a semiconductor material 230 (e.g., silicon, epitaxial silicon). In some examples, the material 225 as illustrated may be a sacrificial material (e.g., silicon germanium), which may be deposited or otherwise formed in layers with (e.g., between) layers of the semiconductor material 230, and which may be removed (e.g., exhumed) in a later operation and replaced with another material, such as a dielectric material (e.g., silicon nitride) to provide an electrical isolation (e.g., along the z-direction, between layers of the semiconductor material 230). In some other examples, the material 225 as illustrated may be a dielectric material (e.g., silicon nitride) which, in various examples, may be deposited or otherwise in layers with (e.g., between) layers of the semiconductor material 230, or may be illustrative of a material that replaced a sacrificial material (e.g., after a removal of the sacrificial material, such as in an exhume operation) that was formed (e.g., deposited, oxidized) between layers of the semiconductor material 230.

In some cases, forming the material arrangement 200 may be supported by forming a stack of alternating layers (e.g., alternating layers of the semiconductor material 230 and the material 225, or a material that may be removed to form voids in which the material 225 may be formed) over a substrate (e.g., a semiconductor wafer, a substrate of crystalline semiconductor, not shown). For illustrative purposes, a stack of alternating layers supporting the formation of the material arrangement 200, may include five layers of the material 225 and four layers of the semiconductor material 230. However, a stack of alternating layers may include any quantity of layers of the material 225 and any quantity of layers of the semiconductor material 230.

Forming the material arrangement 200 may also include forming one or more trenches through the stack of alternating layers. As described herein, a trench may refer to a region formed by a subtractive operation (e.g., a dry etch operation, a wet etch operation) where one or more materials (e.g., material layers) are removed along the z-direction via an opening that may be elongated along one or more directions in an xy-plane (e.g., along the x-direction, along the y-direction, along other directions or combinations of directions, at an exposed surface of the semiconductor die), which may include trenching around a perimeter of a portion of a material arrangement. For example, the first manufacturing operation may include forming a stack of alternating layers that is continuous through the region 205-a, the region 205-b, and the region 205-c. Two trenches may be formed such that the stack of alternating layers is separated between the region 205-a, the region 205-b, and the region 205-c. In some cases, forming the material arrangement 200 may include forming (e.g., depositing) a layer of a masking material (e.g., a hard mask, not shown) over the stack of alternating layers. The layer of the masking material may be formed over the stack of alternating layers (e.g., over a top layer of the material 225, over a top layer of the semiconductor material 230), and may support various photolithography operations (e.g., patterning openings for trenches or other cavities).

In some cases, forming the material arrangement 200 may include forming voids (e.g., recesses) between one or more layers of the material 225, between one or more layers of the semiconductor material 230, or both. In some examples, forming a void (e.g., forming a recess, exhuming) may refer at least in part to removing one or more materials (e.g., sacrificial materials) between layers of material that are not removed, which may include a material removal along a direction in an xy-plane. For example, a trench may be used to access and form a void between layers of the semiconductor material 230 (e.g., a void in one or more layers of a sacrificial material, via an exposed sidewall of the sacrificial material). In some cases, a void may be formed by an etching operation (e.g., a wet etch operation), which may expose sidewalls of a material (e.g., the material 225). In some examples, the etching operation may expose surfaces of a material (e.g., the material 225) in an xz-plane, in a yz-plane, or a combination thereof. In some examples, an etching operation may remove one or more portions of a sacrificial material. For example, the etching operation may offset, along the x-direction, along the y-direction, or both, portions of (e.g., sidewalls of) one or more layers of the sacrificial material.

In some examples, forming the material arrangement 200 may include forming a dielectric material 245 (e.g., a film of an inter-tier dielectric (ITD)), which may include a formation at least on sidewalls of the material 225. The dielectric material 245 may be formed (e.g., deposited) on exposed sidewalls (e.g., sidewalls in at least an xz-plane) of one or more layers of the material 225. Although the material arrangement 200 illustrates an example in which each layer of the semiconductor material 230 intersects the dielectric material 245, in some other examples, one or more layers of the semiconductor material 230 may not intersect the dielectric material 245, or the dielectric material 245 may be formed in another configuration or omitted. In some cases, the dielectric material 245 may be silicon nitride.

Additionally, or alternatively, forming the material arrangement 200 may also include forming layers of a gate oxide material 250. In some examples, the gate oxide material 250 may be formed on sidewalls of the layers of the dielectric material 245. Layers of the gate oxide material 250 may extend along directions in an xz-plane and may be formed (e.g., deposited) on one or more extents (e.g., along the y-direction) of a respective layer of the dielectric material 245. For example, the region 205-$b$ may include two layers of the gate oxide material 250. Although the material arrangement 200 illustrates an example in which each layer of the semiconductor material 230 intersects the gate oxide material 250, in some other examples, one or more layers of the semiconductor material 230 may not intersect the gate oxide material 250, or the gate oxide material 250 may be formed in another configuration or omitted. In some cases, the gate oxide material 250 may be germanium oxide.

Forming the material arrangement 200 may also include forming one or more word line conductors 210 using a conductive material 255. The one or more word line conductors 210 may extend along the x-direction. In some cases, the one or more word line conductors 210 may be formed to bypass or surround (e.g., enclose, in an xz-plane) around the semiconductor material 230. In some examples, a portion of a word line conductor 210 that bypasses or surrounds a portion of the semiconductor material 230 may support a gate portion of a switching component 135, and the portion of the semiconductor material 230 may support a channel portion of the switching component 135. In some examples, the portion of the word line conductor 210 may be separated from the portion of the semiconductor material 230 by a gate oxide material, which may be the same as the gate oxide material 250 (e.g., germanium oxide), or may be a different material than the gate oxide material 250, or may be implemented in the absence of the gate oxide material 250. In some cases, the conductive material 255 may be titanium nitride.

Forming the material arrangement 200 may also include forming one or more digit line conductors 215 and one or more plate conductors 220 using the conductive material 255. The digit line conductors 215 may extend along the z-direction. In some examples, the digit line conductors 215 may be coupled (e.g., physically, electrically) between respective doped regions 260 (e.g., of the semiconductor material 230), in which case the respective doped regions 260 also may support a channel portion of a respective switching component 135. The plate conductors 220 may extend along the z-direction and may be electrically coupled with respective layers of semiconductor material 230. In some cases, forming plate conductors 220 may occur prior forming the stack of alternating layers of the material 225 and the semiconductor material 230. In some other cases, forming plate conductors 220 may occur after forming the stack of alternating layers of the material 225 and the semiconductor material 230 (e.g., by forming a trench through the stack and depositing the conductive material 255 in the trench).

The material arrangement 200 also may include one or more capacitors 130, which may support storing a charge corresponding to a stored logic state of the memory cell 105. In some cases, each capacitor 130 of a two-dimensional set (e.g., in an xz-plane) may be coupled with a same plate conductor 220, and a plate conductor 220 may be coupled between two of such two-dimensional sets of capacitors 130. The capacitors 130 may each be operable to couple with a digit line conductor 215 based on a voltage applied to a respective switching component 135 via a word line conductor 210. In some examples, the capacitors 130 may utilize an intrinsic capacitance of the semiconductor material 230 between a respective switching component 135 and a respective plate conductor 220. In some other examples, a capacitor 130 may be supported by one or more other materials, not shown, that otherwise support such a capacitance or a polarization (e.g., utilizing a ferroelectric material as part of a capacitor 130).

In some cases, word line conductors 210 may extend along the x-direction into staircase regions 270. For example, a first stack of word line conductors 210 may extend into a staircase region 270-$a$ and a second stack of word line conductors 210 may extend into a staircase region 270-$b$. Although not shown in FIG. 2, each word line conductor 210 of a stack (e.g., along the z-direction) may have a different extent (e.g., length, along the x-direction) in a staircase region 270. That is, a staircase region 270 may include a respective portion of multiple word line conductors 210 (e.g., stacks of word line conductors 210), and each word line conductor 210 may have a different extent along the x-direction, thereby forming a staircase structure.

To scale aspects of the material arrangement 200 in accordance with a greater quantity of memory cells 105 (e.g., a greater quantity of decks along the z-direction, a higher density of memory cells 105 in an xy-plane), an area of a semiconductor substrate to support circuitry for accessing the memory arrays 280 may increase, which may lead to various limitations (e.g., related to the limited area of a substrate to support a growing quantity of memory cells and, by extension, a growing quantity and area for such substrate-based circuitry). To improve scalability of related memory devices, aspects of memory arrays (e.g., memory arrays 280) and associated access line conductors, may be implemented in a first semiconductor die (e.g., over a first semiconductor substrate), and at least some circuitry for accessing the memory arrays (e.g., word line drivers configured for biasing word line conductors 210) may be implemented in a second semiconductor die (e.g., using a second semiconductor substrate). To form the associated memory device, the second semiconductor die (e.g., including formed memory array access circuitry) may be located in contact with or otherwise adjacent to the first semiconductor die (e.g., including formed memory arrays and access line conductors), and electrical contacts may be formed to couple the circuitry for accessing the memory arrays (e.g., word line drivers) with the access line conductors (e.g., word line conductors) of the first semiconductor die.

Figure 3:
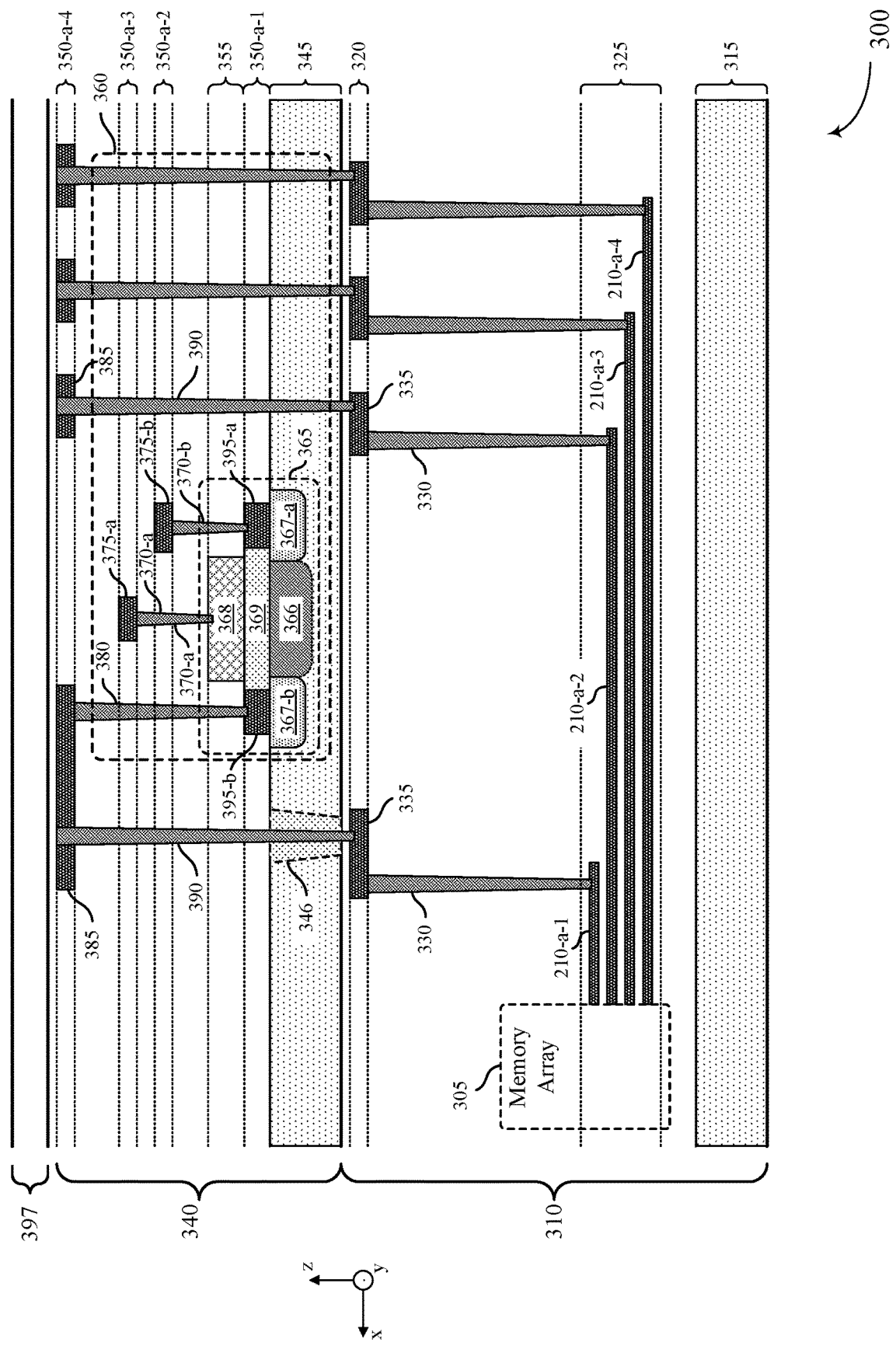

FIG. 3 illustrates an example of a material arrangement 300 that supports word line drivers for multiple-die memory devices in accordance with examples as disclosed herein. For example, FIG. 3 illustrates a cross-section of the material arrangement 300 in an xy-plane. The material arrangement 300 illustrates an example of features that may be implemented in a semiconductor die 310, associated with a substrate 315, and a semiconductor die 340, associated with a substrate 345. The substrate 315 and the substrate 345 each may be an example of a semiconductor substrate, such as a respective portion of a semiconductor wafer (e.g., a wafer of a crystalline semiconductor, a wafer of crystalline silicon), which each may extend along an xy-plane.

The semiconductor die 310 may include one or more memory arrays 305, each of which may be an example of a memory array 280 as described with reference to FIGS. 2A and 2B, among other examples of an array of memory cells 105. The memory array 305 may be associated with (e.g., include, be coupled with) word line conductors 210-$a$ (e.g., word line conductors 210-$a$-1 through 210-$a$-4 of a word line level 325), among other access line conductors (not shown). The word line conductors 210-$a$ may each extend along the x-direction (e.g., into the memory array 305) and, in some examples, word line conductors 210-$a$ may be arranged in sets (e.g., stacks) along the z-direction. Although a single set of word line conductors 210-$a$ is illustrated (e.g., in the illustrated xz-plane), such an arrangement may be repeated at various locations along the y-direction (e.g., associated with a two-dimensional arrangement of word line conductors 210-$a$ in a yz-plane) to support a three-dimensional array of memory cells 105. Each of the word line conductors 210-$a$ may be operable to access a respective set of one or more memory cells 105 of the memory array 305 (e.g., to access a row of memory cells 105, by activating a row of switching components 135 along the x-direction). In some examples, sets of word line conductors 210-$a$ may be configured in a staircase arrangement, which may be an example of a staircase arrangement associated with staircase regions 270 described with reference to FIG. 2. For example, as illustrated, each of the word line conductors 210-$a$, located at respective positions along the z-direction, may have different extents along the x-direction.

The semiconductor die 310 also may include one or more routing layers 320 (e.g., redistribution layers), which may support conductor portions that route signals of the semiconductor die 310 along one or more directions in a yz-plane. For example, a routing layer 320 may include conductor portions 335, which each may be electrically coupled with a respective word line conductor 210-$a$ (e.g., via a respective electrical contact 330 along the z-direction). In some examples, the conductor portions 335 may be implemented as a landing pads or contact patches for electrical contacts formed between the semiconductor die 310 and the semiconductor die 340, and at least some of the conductor portions 335 may have extents along the z-direction that are at least partially overlapping (e.g., in accordance with being formed in a routing layer 320). Conductor portions 335, among other conductor portions of the one or more routing layers 320, may be formed by various additive or subtractive operations (e.g., photolithography operations). Although the conductor portions 335 are illustrated below a surface of the semiconductor die 310 (e.g., along the z-direction, which may illustrate a location beneath a layer of another material, such as an oxide), in some examples, one or more conductor portions 335 may be located at a surface of the semiconductor die 310 (e.g., at a top surface, at a bottom surface, at either surface along the z-direction).

The semiconductor die 340 may include various implementations of word line driver circuitry 360, which may be configured to bias the word line conductors 210-$a$ of the semiconductor die 310. For example, the word line driver circuitry 360 may include a respective word line driver circuit operable to bias a respective one of the word line conductors 210 of the semiconductor die 310. In some examples, each word line driver circuit of the word line driver circuitry 360 may be operable to bias a respective word line conductor 210-$a$ based at least in part on word line decoder signals, such as at least a first word line decoder signal and a second word line decoder signal, which may be associated with various decoding schemes. In some examples, such word line driver circuits may be included in the word line driver circuitry 360 as a two-dimensional arrangement in an xy-plane.

The word line driver circuitry 360 may include one or more transistors formed in accordance with a transistor structure 365, each of which may be operable based at least in part on doped portions of the substrate 345. For example, the transistor structure 365 illustrates an example of a transistor channel, electrically coupled between terminals 395 (e.g., a terminal 395-$a$ and a terminal 395-$b$), that includes a doped portion 366 and doped portions 367, where the doped portions 366 and 367 may refer to portions of the substrate 345 that are associated with different types of doping. In various examples, one of the terminals 395 may be referred to as a source terminal, and the other of the terminals 395 may be referred to as a drain terminal, where such a designation may be based on a configuration or relative biasing of a circuit that includes the transistor structure 365. The channel (e.g., a channel portion) of a transistor may include or refer to one or more portions of the transistor structure 365 that are operable to open or close a conductive path (e.g., to operate in accordance with a modulated conductivity, to form a channel, to open a channel, to close a channel) between a source and drain (e.g., between the terminals 395) based at least in part on a voltage of a gate (e.g., a gate terminal, a gate portion 368). In other words, a channel portion of a transistor structure may be configured to be activated, deactivated, made conductive, or made non-conductive, based at least in part on a voltage of a gate portion, such as gate portion 368. In some examples of transistor structure 365 (e.g., a planar transistor arrangement), the channel portion formed by doped portions 366 and 367 may support a conductive path in a generally horizontal or in-plane direction (e.g., along the x-direction, within an xy-plane, in a direction within or parallel to a surface of the substrate 345).

In some examples, the gate portion 368 (e.g., of a gate layer 355) may be physically separated from the channel portion (e.g., separated from the substrate 345, separated from one or more of the doped portions 366 or 367) by a gate insulation portion 369 (e.g., a gate dielectric). Each of the terminals 395 may be in contact with or otherwise coupled with (e.g., electrically, physically) a respective doped portion 367, and each of the terminals 395 and the gate portion 368 may be formed from an electrically conductive material such as a metal or metal alloy, or a semiconductor material (e.g., a polycrystalline semiconductor, polysilicon).

In some examples, the transistor structure 365 may be operable as an n-type or n-channel transistor, where applying a relatively positive voltage to the gate portion 368 that is above a threshold voltage (e.g., an applied voltage having a positive magnitude, relative to a source terminal, that is greater than a threshold voltage) activates the channel portion or otherwise enables a conductive path between the terminals 395 (e.g., along a direction generally aligned with the x-direction within the substrate 345). In such examples, the doped portions 367 may refer to portions having n-type doping or n-type semiconductor, and doped portion 366 may refer to portions having p-type doping or p-type semiconductor (e.g., a channel portion having an NPN configuration along the x-direction or channel direction, an n-type transistor doped portion).

In some examples, the transistor structure 365 may be operable as a p-type or p-channel transistor, where applying a relatively negative voltage to the gate portion 368 that is above a threshold voltage (e.g., an applied voltage having a negative magnitude, relative to a source terminal, that is greater than a threshold voltage) activates the channel portion or otherwise enables a conductive path between the terminals 395. In such examples, the doped portions 367 may refer to portions having p-type doping or p-type semiconductor, and doped portion 366 may refer to portions having n-type doping or n-type semiconductor (e.g., a channel portion having a PNP configuration along the x-direction or channel direction, a p-type transistor doped portion).

The semiconductor die 340 also may include one or more routing layers 350 (e.g., redistribution layers), which may support conductor portions that route signals of the semiconductor die 340 along one or more directions in an xy-plane. For example, one or more routing layers 350 (e.g., routing layer 350-a-1) may be used to form terminals 395 of the transistor structure 365, which may include conductive traces between multiple transistors in accordance with the transistor structure 365. In some examples, a routing layer 350-a-1 may be omitted, and terminals 395 may be formed at least in part from electrical contacts (e.g., electrical contacts 370, electrical contacts 380). Additionally, or alternatively, one or more routing layers 350 (e.g., routing layers 350-a-2 and 350-a-3) may be used to form conductor portions 375 that are coupled with transistors in accordance with the transistor structure 365 (e.g., via electrical contacts 370, in the presence or absence of terminals 395), which may include conductor portions between the transistors of a given word line driver circuit, or between transistors and a word line decoder (e.g., of a row decoder 120, not shown) that may be located in the semiconductor die 340.

Additionally, or alternatively, one or more routing layers 350 (e.g., routing layer 350-a-4) may include conductor portions 385, which each may be electrically coupled with a respective word line driver circuit (e.g., of the word line driver circuitry 360, a respective transistor in accordance with the transistor structure 365, via an electrical contact 380). In some examples, the conductor portions 385 may be implemented as landing pads or contact patches for electrical contacts formed between the semiconductor die 310 and the semiconductor die 340, and at least some of the conductor portions 385 may have extents along the z-direction that are at least partially overlapping (e.g., in accordance with being formed in the routing layer 350-a-4). Conductor portions of the one or more routing layers 350 may also be formed by various additive or subtractive operations (e.g., photolithography operations). Although the example of material arrangement 300 illustrates certain relative positioning among the routing layers 350-a, such routing layers 350-a, or constituent conductor portions, may be arranged in different relative positioning (e.g., order) along the z-direction. Further, although the example of material arrangement 300 illustrates a certain quantity of routing layers 350-a, a material arrangement in accordance with examples as disclosed herein may include any quantity of routing layers 350-a, which may include conductor portions 385 and conductor portions 375 in a same routing layer 350. Although the conductor portions 385 are illustrated below a surface of the semiconductor die 340 (e.g., along the z-direction, which may illustrate a location beneath a layer of another material, such as an oxide), in some examples, one or more conductor portions 385 may be located at (e.g., coincident with) a surface of the semiconductor die 340 (e.g., at a top surface, at a bottom surface, at either surface along the z-direction).

The material arrangement 300 also illustrates electrical contacts 390, each of which may be coupled with (e.g., coincident with, contact, extend into, extend through) at least a portion of the semiconductor die 310 (e.g., at least a portion of a conductor portion 335) and at least a portion of the semiconductor die 340 (e.g., at least a portion of a conductor portion 385). Each of the electrical contacts 390 may couple a respective word line conductor 210-a with a respective word line driver circuit (e.g., at least one transistor of the word line driver circuitry 360 that is formed in accordance with the transistor structure 365). In some examples, the electrical contacts 390 may be formed after forming the word line driver circuitry 360, among other features of the semiconductor die 340, after forming the one or more memory arrays 305 and word line conductors 210-a, among other features of the semiconductor die 310, or both. In some examples, electrical contacts 390 may be formed through at least one layer of the semiconductor die 340, or through at least one layer of the semiconductor die 310, or through a bonding layer (e.g., an oxide layer, a fusion layer) of or between the semiconductor die 310 and the semiconductor die 340, or any combination thereof, among other configurations.

In some examples, each electrical contact 390 may extend (e.g., along the z-direction) through the substrate 345. For example, the semiconductor die 340 may be located (e.g., placed, fixtured, attached, bonded) in contact with or otherwise adjacent to the semiconductor die 310 (e.g., in accordance with a die-on-die bonding, in accordance with a wafer-on-wafer bonding, in accordance with an oxide bonding), and cavities may be formed through the semiconductor die 340 (e.g., through the substrate 345) and, in some examples, through at least a portion of the semiconductor die 310 or otherwise exposing a conductor portion 335 (e.g., located at a surface of the semiconductor die 310 or below a surface of the semiconductor die 310, such as beneath an oxide of other dielectric portion). In some examples, such locating may include an oxide bonding between the semiconductor die 310 and the semiconductor die 340 (e.g., a wafer-oxide-wafer (WoW) bonding, a fusion bonding), which may involve an oxide layer of the semiconductor die 310, or an oxide layer of the semiconductor die 340, or a layer of oxide material formed between the semiconductor die 310 and the semiconductor die 340, or any combination thereof, among other configurations of materials for such a bonding.

Although the semiconductor die 340 is illustrated with the substrate 345 being beneath other layers of the semiconductor die 340 (e.g., along the z-direction, in a face-to-back bonding), in some other examples, the semiconductor die 340 may be located in contact with the semiconductor die 310 such that the substrate 345 is above the other layers of the semiconductor die 340 (e.g., in accordance with a face-to-face bonding). After forming the cavities, the electrical contacts 390 may then be formed at least in part from forming (e.g., depositing) a conductive material in the cavities. In some examples, each of such cavities may be coincident with a respective conductor portion 385 and a respective conductor portion 335, such that an electrical contact 390 may be coincident with the respective conductor portion 385 and the respective conductor portion 335. In some examples, forming the semiconductor die 340 may include forming cavities through the substrate 345 (e.g., before locating the semiconductor die 340 with the semiconductor die 310) and forming dielectric portions 346 (e.g., based on depositing a dielectric material in the cavities through the substrate 345). In some examples, one or more of the electrical contacts 390 may be formed through such a dielectric portion 346.

In some other examples, one or more of the electrical contacts 390 may be omitted, and the described techniques for including access line conductors and access line drivers in different semiconductors may be supported by other interconnection techniques between the portions of the semiconductor die 310 and the semiconductor die 340. For example, conductor portions 335 may be coincident with a surface of the semiconductor die 310, and conductor portions 385 may be coincident with a surface of the semiconductor die 340. In such examples, the respective surfaces of the semiconductor die 310 and the semiconductor die 340 may be located coincident with each other, and conductor portions 335 may be coupled with conductor portions 385 with an intervening conductor material (e.g., respective portions of a solder material), or without an intervening conductor material (e.g., in accordance with a direct coupling, such as a thermo-mechanical bonding, a metal-to-metal bonding, or a wafer-to-wafer hybrid bonding). In some other examples, conductor portions 335 may be omitted such that an electrical contact 390 may be formed in contact with an electrical contact 330.

In some examples, the material arrangement 300 may include a layer 397 (e.g., an upper layer). A layer 397 may include various materials or circuit elements formed after forming the electrical contacts 390. In some examples, the layer 397 may include routing or packaging conductors (e.g., back-end-of-line conductors or other metallization, wire bonding contacts, solder bonding contacts, one or more integrated redistribution layers) or other circuit elements that support operations of a memory device that includes the material arrangement 300. Additionally, or alternatively, the layer 397 may include a dielectric material that isolates (e.g., electrically, physically) features of the semiconductor die 340, such as providing an electrical isolation of the conductor portions 385 or electrical contacts 390.

Figure 4:
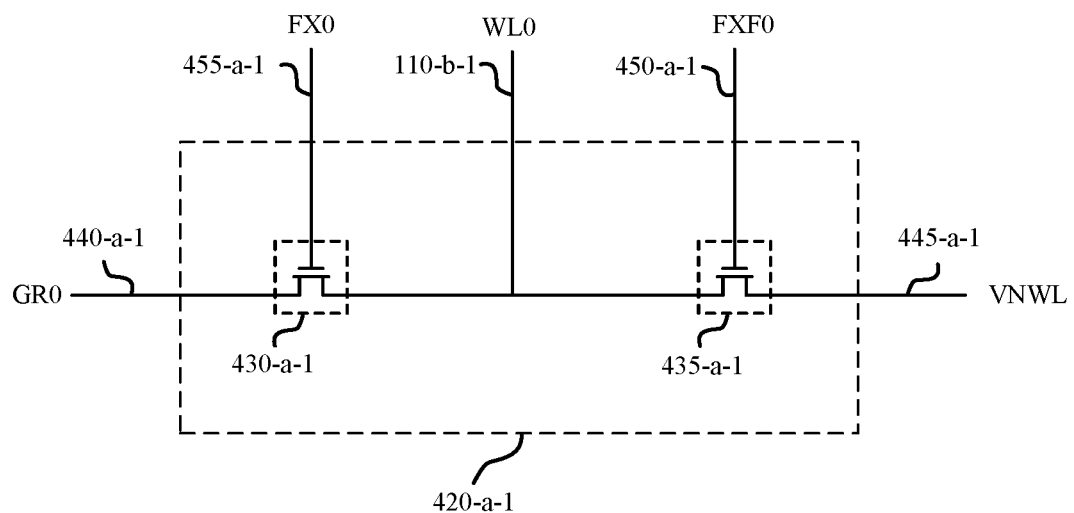
FIG. 4 illustrates an example of word line driver circuitry that supports word line drivers for multiple-die memory devices in accordance with examples as disclosed herein.
Figure 4:
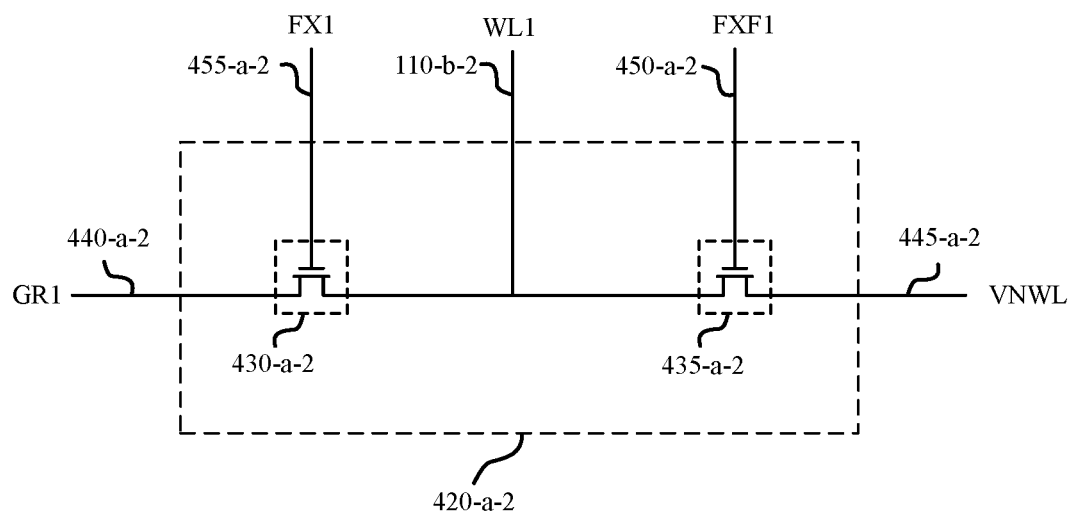

FIG. 4 illustrates an example of circuitry 400 that supports word line drivers for multiple-die memory devices in accordance with examples as disclosed herein. The circuitry 400 may be an example of a portion of word line driver circuitry 360 (e.g., included in a semiconductor die 340) as described with reference to FIG. 3. The circuitry 400 includes word line driver circuits 420 (e.g., word line driver circuits 420-a-1 and 420-a-2, sub-wordline drivers), which each may be operable to bias a respective word line 110 (e.g., word lines 110-b-1 and 110-b-2, respectively, which may be associated with respective word line conductors 210 of another semiconductor die, such as a semiconductor die 310). Although illustrated with two word line driver circuits 420-a, one or more instances of the circuitry 400 may be implemented in a memory device to include a respective word line driver circuit 420-a for each of the word lines 110 of the memory device.

Each of the word line driver circuits 420 may include one or more transistors that are operable based on one or more doped portions of a substrate (e.g., a substrate 345). For example, each word line driver circuit 420-a may include a respective transistor 430-a, which may have a channel electrically coupled between a respective word line 110-b (e.g., a respective word line conductor 210, an output of the word line driver circuit 420-a, via a conductor portion 385, an electrical contact 390, and a conductor portion 335) and an output of a word line decoder (e.g., a portion of a row decoder 120, via a respective input 440-a, via a conductor portion 375, a word line selection voltage source) associated with a respective third word line decoder signal (e.g., a signal GR #) or other word line selection voltage. For example, the word line decoder may output one or more word line selection voltages, which may be decoded for respective subsets of word line conductors 210. Each transistor 430-a also may have a gate coupled with an output of the word line decoder (e.g., via a respective input 455-a, via a conductor portion 375) associated with a respective first word line decoder signal (e.g., a signal FX #). Each word line driver circuit 420-a also may include a respective transistor 435-a, which may have a channel electrically coupled between the respective word line 110-b and a word line deselection voltage source (e.g., a source that provides a voltage VNWL, which may be a ground voltage, a negative voltage, or another deselection voltage, via a respective input 445-a, via a conductor portion 375). Each transistor 435-a also may have a gate coupled with an output of the word line decoder (e.g., via a respective input 450-a) associated with an inverse of the respective first word line decoder signal (e.g., a signal FXF #, which may be a respective second word line decoder signal).

In some examples, one or more of the transistors of a word line driver circuit 420 may be formed in accordance with the transistor structure 365 described with reference to FIG. 3. For example, each of the transistors 430-a and 435-a may have a respective channel (e.g., between terminals 395) formed from a doped portion 367 between doped portions 366, and each of the transistors 430-a and 435-a may have a respective gate formed from a gate portion 368. In some examples, the transistors 430-a and 435-a may be associated with a same channel type (e.g., an n-type channel, associated with an NPN doping arrangement). In various examples, the word line decoder may be located on the same semiconductor die as the circuitry 400 (e.g., a semiconductor die 340), or the word line decoder may be located on a different semiconductor die than the circuitry 400 (e.g., a semiconductor die 310).

According to these and other examples, each word line driver circuit 420-a may be operable to bias a respective word line conductor 210 based at least in part on a respective first word line decoder signal (e.g., a respective signal FX #) and a respective second word line decoder signal (e.g., a respective signal FX #) associated with a logical inverse of the respective first word line decoder signal. In some examples, each word line driver circuit 420-a also may be operable to bias a respective word line conductor 210 based at least in part on a respective third word line decoder signal (e.g., a respective signal GR #, a decoded word line selection voltage). Although the word line driver circuits 420-a are illustrated with separate inputs 450-a and 455-a, in some other examples, the word line driver circuits 420-a may include an inverter component that generates a respective signal FXF # based on an inversion (e.g., a logical inversion) of the respective signal FX #, among other configurations. In some examples, the respective first word line decoder signal, the respective second word line decoder signal, or both may be associated with selecting from a set (e.g., a two-dimensional arrangement) of word line conductors 210 along a direction over a substrate of the first semiconductor die (e.g., a selection along the y-direction), and the respective third word line decoder signal may be associated with selecting from the set of word line conductors 210 along a direction away from the substrate (e.g., a selection along the z-direction), among other decoding configurations.

A set of word line driver circuits 420-a may be configured to support various selections and deselections of sets of memory cells 105 (e.g., rows of memory cells). For example, a word line 110-b may be biased with a word line selection voltage (e.g., an activation voltage for switching components 135) in accordance with a first operational state of a corresponding word line driver circuit 420-a (e.g., corresponding to an active GR # signal, which may be equal to the word line selection voltage, and an active FX # signal), which may be associated with an activated channel of the respective transistor 430-a and a deactivated channel of the respective transistor 435-a. Other word lines 110-b (e.g., deselected word lines, deactivated word lines) may be biased with a word line deselection voltage (e.g., a voltage VNWL, a deactivation voltage for switching components 135) in accordance with one or more other operational states of corresponding word line driver circuits 420. For example, the word line deselection voltage may be applied to a respective word line 110-b in a second operational state of a corresponding word line driver circuit 420-a (e.g., corresponding to an inactive FX # signal), which may be associated with a deactivated channel of the respective transistor 430-a and a activated channel of the respective transistor 435-a. In some other examples, a word line deselection voltage may be applied to a respective word line 110-b in a third operational state of a corresponding word line driver circuit 420-a (e.g., corresponding to an active FX # signal and an inactive GR # signal), which may be associated with an activated channel of the respective transistor 430-a and a deactivated channel of the respective transistor 435-a, where an inactive GR # signal may have the same voltage as VNWL, or a ground voltage, or some other voltage. Thus, in accordance with these and other examples, deselected word lines 110-b may be held at a deselection voltage (e.g., VNWL, a deactivated GR #), which may be accompanied by a deactivated GR # signal (e.g., a ground signal, a word line deselection voltage) or an activated GR # signal.

Figure 5:
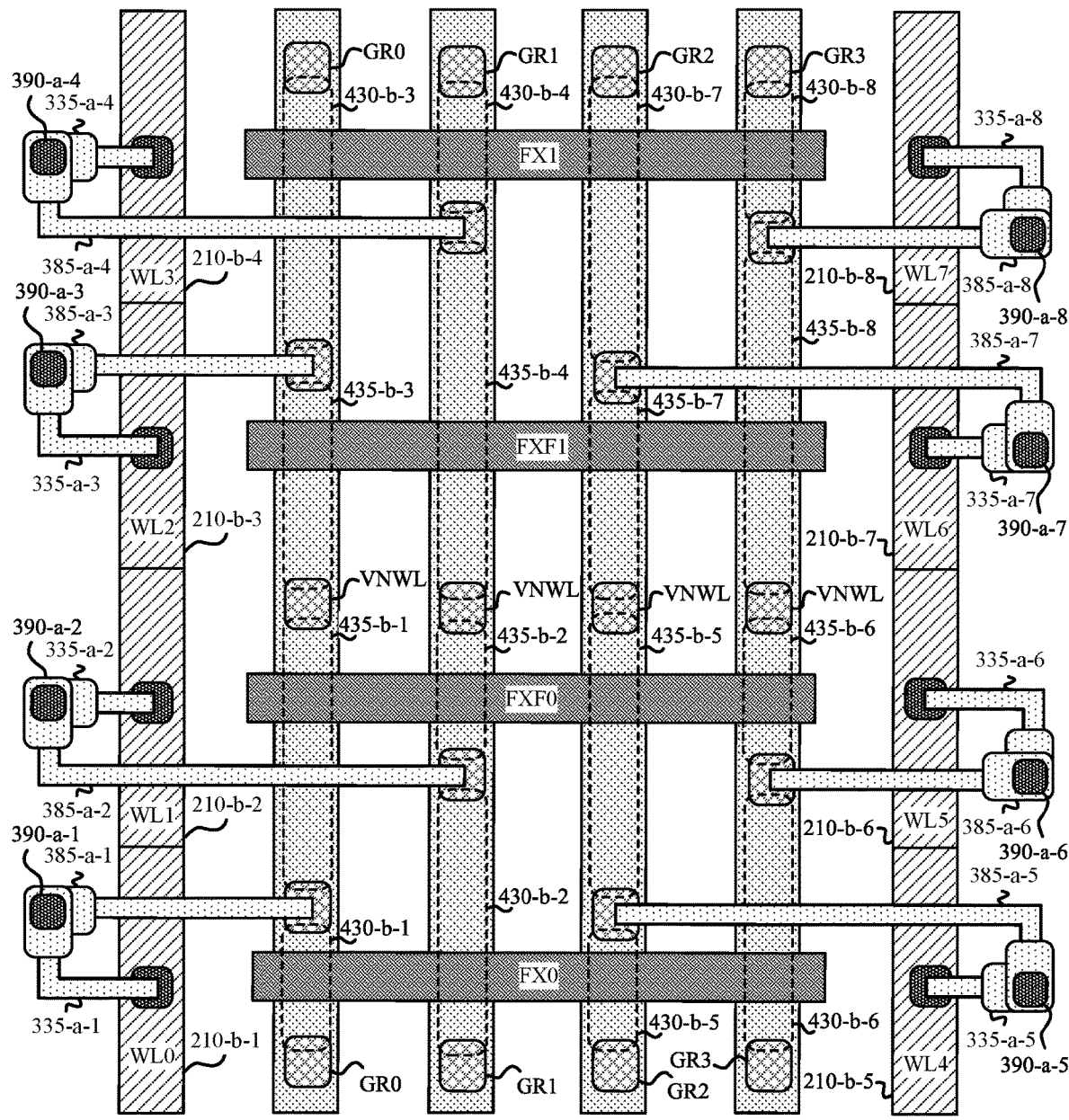
FIGS. 5 through 7 illustrate examples of material arrangements that support word line drivers for multiple-die memory devices in accordance with examples as disclosed herein.

FIG. 5 illustrates an example of a material arrangement 500 that supports word line drivers for multiple-die memory devices in accordance with examples as disclosed herein. The material arrangement 500 illustrates material portions that may be implemented in multiple semiconductor dies of a memory device. For example, the material arrangement illustrates word line conductors 210-b (e.g., in a staircase arrangement, with different word line conductors 210-b along the z-direction having different extents along the x-direction) and conductor portions 335-a that may be implemented in a first semiconductor die (e.g., a semiconductor die 310), as well as transistors 430-b, transistors 435-b, and conductor portions 385-a that may be implemented in a second semiconductor die (e.g., a semiconductor die 340). The material arrangement 500 is illustrated in a view along the z-direction, and illustrates material portions that may be located at various positions along the z-direction.

The material arrangement 500 illustrates an example of n-type transistor doped portions 520, gate portions 530, and terminal portions 540. In some examples, extents of n-type transistor doped portions 520 may be illustrative of extents of contiguous doping configurations (e.g., supporting doped portions 366 and doped portions 367 for respective transistors, supporting NPN transistor channels having n-type doping and p-type doping). In some examples, extents of gate portions 530 and terminal portions 540 may be illustrative of extents of contiguous material portions (e.g., supporting gate portions 368 and terminals 395, respectively, which may be shared or otherwise contiguous across multiple transistors). In some examples, gate portions 530 may be formed in a common layer of the material arrangement (e.g., in a gate layer 355). Other material portions (e.g., dielectric portions, additional routing portions) may be omitted for the sake of illustrative clarity.

The material arrangement 500 illustrates an arrangement of material portions that may support decoding eight word lines 110 (e.g., WL0 through WL7, associated with eight word line conductors 210-b). For example, to support accessing (e.g., selecting, biasing) the word line WL0, associated with word line conductor 210-b-1, the material arrangement 500 includes a transistor 430-b-1 and a transistor 435-b-1 (e.g., of a word line driver circuit 420 for the word line WL0). Such transistors may be coupled with the word line conductor 210-b-1 via a conductor portion 385-a-1 (e.g., of a semiconductor die 340), a conductor portion 335-a-1 (e.g., of a semiconductor die 310), and an electrical contact 390-a-1 (e.g., along the z-direction, coupled with at least a portion of the semiconductor die 310 and with at least a portion of the semiconductor die 340).

The transistors of the word line driver circuit 420 associated with the word line WL0 may be coupled with various voltage sources and outputs of a word line decoder. For example, the transistor 430-b-1 may include a channel between a terminal portion 540 biased with the signal GR0 and a terminal portion 540 coupled with the conductor portion 385-a-1, as well as a gate portion 530 operable to modulate a conductivity of the channel based on a biasing with the signal FX0. The transistor 435-b-1 may include a channel between a terminal portion 540 biased with the word line deselection voltage VNWL and a terminal portion 540 coupled with the conductor portion 385-a-1, as well as a gate portion 530 operable to modulate a conductivity of the channel based on a biasing with the signal FXF0. Such an arrangement may be functionally repeated for each of the other word lines (e.g., word lines WL1 through WL7) in accordance with the illustrated material portions, couplings, and biasing. For example, to support accessing (e.g., selecting, biasing) the word line WL1, associated with word line conductor 210-b-2, the conductor portion 335-a-2, the conductor portion 385-a-2, and the electrical contact 390-a-2, the material arrangement 500 includes a transistor 430-b-2 and a transistor 435-b-2 (e.g., of a word line driver circuit 420 for the word line WL1), and so on.

As shown, in the example of material arrangement 500, the signals GR # may be associated with decoding word line conductors 210-b along at least the y-direction, and the signals FX # and FXF # may be associated with decoding word line conductors 210-b along at least the z-direction. As illustrated in the example of material arrangement 500, gate portions 530 may include contiguous portions of a gate material (e.g., along the y-direction) to form gates for transistors 425-b, or transistors 430-b, or both, that are associated with one or more word lines (e.g., in accordance with a common gate biasing with a signal FX # or FXF #), which may reduce a quantity of electrical contacts 370 compared to techniques that do not implement contiguous portions of gate material between transistors. Further, as illustrated in the example of material arrangement 500, n-type transistor doped portions 520 may include portions of the substrate 345 having a contiguous doping configuration (e.g., along the x-direction) to form channels for transistors 430-*b*, transistors 435-*b*, or both, that are associated with one or more word lines (e.g., associated with coupling with a signal GR # or a word line deselection voltage VNWL). In some examples, such a configuration may support a common doping arrangement throughout regions of a substrate 345 associated with word line driver circuits 420 (e.g., in accordance with a bulk p-type doping and islands of n-type doping for respective NPN transistor channels).

Figure 6:
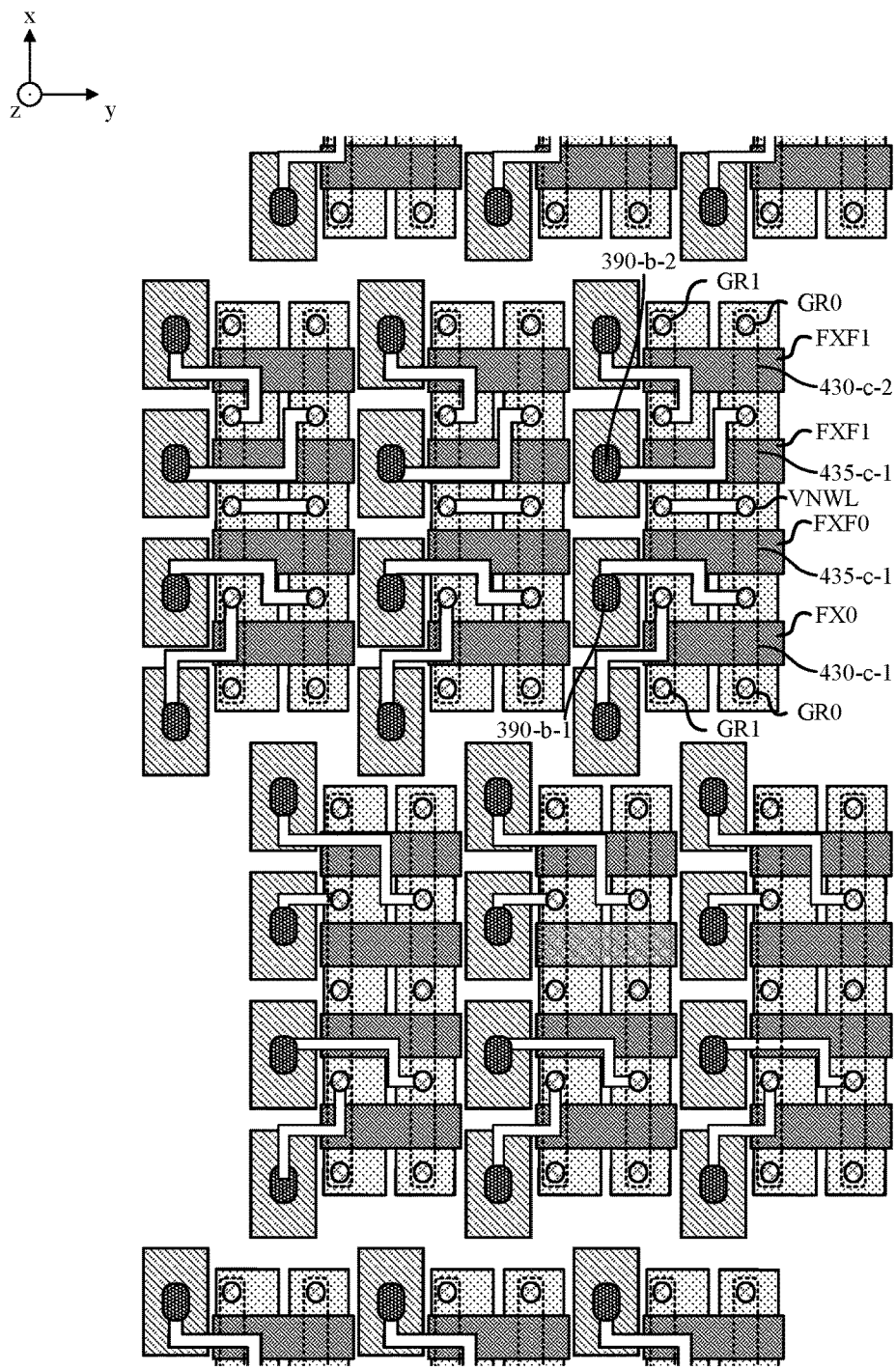

FIG. 6 illustrates an example of a material arrangement 600 that supports word line drivers for multiple-die memory devices in accordance with examples as disclosed herein. The material arrangement 600 illustrates material portions that may be implemented in a semiconductor die of a memory device, such as a semiconductor die 340. The material arrangement 600 is illustrated in a view along the z-direction, and illustrates material portions that may be located at various positions along the z-direction. For example, the material arrangement 600 illustrates transistors 430-*c* and 435-*c*, which may be associated with n-type transistor doped portions 520, gate portions 530, and terminal portions 540, as illustrated. The material arrangement 600 also illustrates electrical contacts 390-*b*, which may extend along the z-direction (e.g., through at least a portion of the semiconductor die associated with the material arrangement 600) and couple the transistors 430-*c* and 435-*c* with word line conductors 210 of another semiconductor die (e.g., a semiconductor die 310). Such a coupling may be provided via conductor portions 610, which may include one or more of a conductor portion 385, an electrical contact 380, a conductor portion 375, or an electrical contact 370, or any combination thereof (e.g., of or through one or more routing layers 350). The word line conductors 210 of the other semiconductor die may extend along the x-direction or along the y-direction (e.g., relative to the material arrangement 600), such that the channels of the transistors 430-*c* and 435-*c* (e.g., along the x-direction) may each extend along a direction parallel to the word line conductors 210, or along a direction perpendicular to the word line conductors 210, among other relative directions. The electrical contacts 390-*b* may extend through window portions 620, each of which may be an example of a dielectric portion 346 described with reference to FIG. 3.

The material arrangement 600 illustrates an arrangement of material portions that may support decoding various quantities of word lines 110 of another semiconductor die. For example, to support accessing (e.g., selecting, biasing) a word line 110 via an electrical contact 390-*b*-1, the material arrangement 600 includes a transistor 430-*c*-1 and a transistor 435-*c*-1 (e.g., of a word line driver circuit 420 for the corresponding word line 110). The transistors of the word line driver circuit 420 associated with the electrical contact 390-*b*-1 may be coupled with various voltage sources and outputs of a word line decoder. For example, the transistor 430-*c*-1 may include a channel between a terminal portion 540 biased with the signal GR0 and a terminal portion 540 coupled with the electrical contact 390-*b*-1 (e.g., via the illustrated conductor portion 610), as well as a gate portion 530 operable to modulate a conductivity of the channel based on a biasing with the signal FX0. The transistor 435-*c*-1 may include a channel between a terminal portion 540 biased with the word line deselection voltage VNWL and a terminal portion 540 coupled with the electrical contact 390-*b*-1, as well as a gate portion 530 operable to modulate a conductivity of the channel based on a biasing with the signal FXF0. Such an arrangement may be functionally repeated for each of the other word lines 110 in accordance with the illustrated material portions, couplings, and biasing. For example, to support accessing (e.g., selecting, biasing) a word line associated with the electrical contact 390-*b*-2, the material arrangement 600 includes a transistor 430-*c*-2 and a transistor 435-*c*-2 (e.g., of a word line driver circuit 420 for the corresponding word line 110), and so on.

In some examples of the example of material arrangement 600, the signals GR # may be associated with decoding word line conductors 210 along the x-direction, or the y-direction, or both, and the signals FX # and FXF # may be associated with decoding word line conductors 210-*b* along the z-direction, among other decoding arrangements. Gate portions 530 may include contiguous portions of a gate material (e.g., along the y-direction) to form gates for transistors 430-*c* and transistors 435-*c* that are associated with different word lines 110 (e.g., in accordance with a common gate biasing with a signal, such as a common FX # signal or a common FXF # signal). Further, as illustrated in the example of material arrangement 600, n-type transistor doped portions 520 may include portions of the substrate 345 having a contiguous doping configuration (e.g., along the x-direction) to form channels for transistors 430-*c* and transistors 435-*c* that are associated with one or more word lines 110.

The material arrangement 600 illustrates an example of material portions that may be implemented to support groupings of a four word line pitch. For example, the electrical contacts 390-*b*, and related components (e.g., transistors 430, transistors 435), may include groups of four components that are repeated in sets that are aligned (e.g., in rows of such groups of four components) along the y-direction, and such sets at different locations along the x-direction may include groups, or components thereof, that are staggered in different positions along the y-direction, as shown. For example, electrical contacts 390-*b* and terminal portions 540 may be staggered in the illustrated groups of four (with such components in adjacent groups along the x-direction being non-overlapping along the x-direction), and in some examples, electrical contacts 390-*b* and terminal portions 540 of adjacent groups along the y-direction may be overlapping (e.g., aligned) along the y-direction. In some examples, such aspects of the material arrangement 600 may facilitate certain arrangements of material portions (e.g., word line conductors 210, conductor portions 335, electrical contacts 330, conductor portions 385, electrical contacts 380, electrical contacts 370, electrical contacts 390), certain word line decoding schemes (e.g., routing schemes for signals from a word line decoder), or both. Although certain quantities of respective components are shown in FIG. 6, such components may be repeated in different quantities along the x-direction, along the y-direction, or both to accommodate different arrangements, quantities, or decoding schemes of word lines 110 (e.g., arranged along the y-direction, arranged along the z-direction) in the associated memory device.

Figure 7:
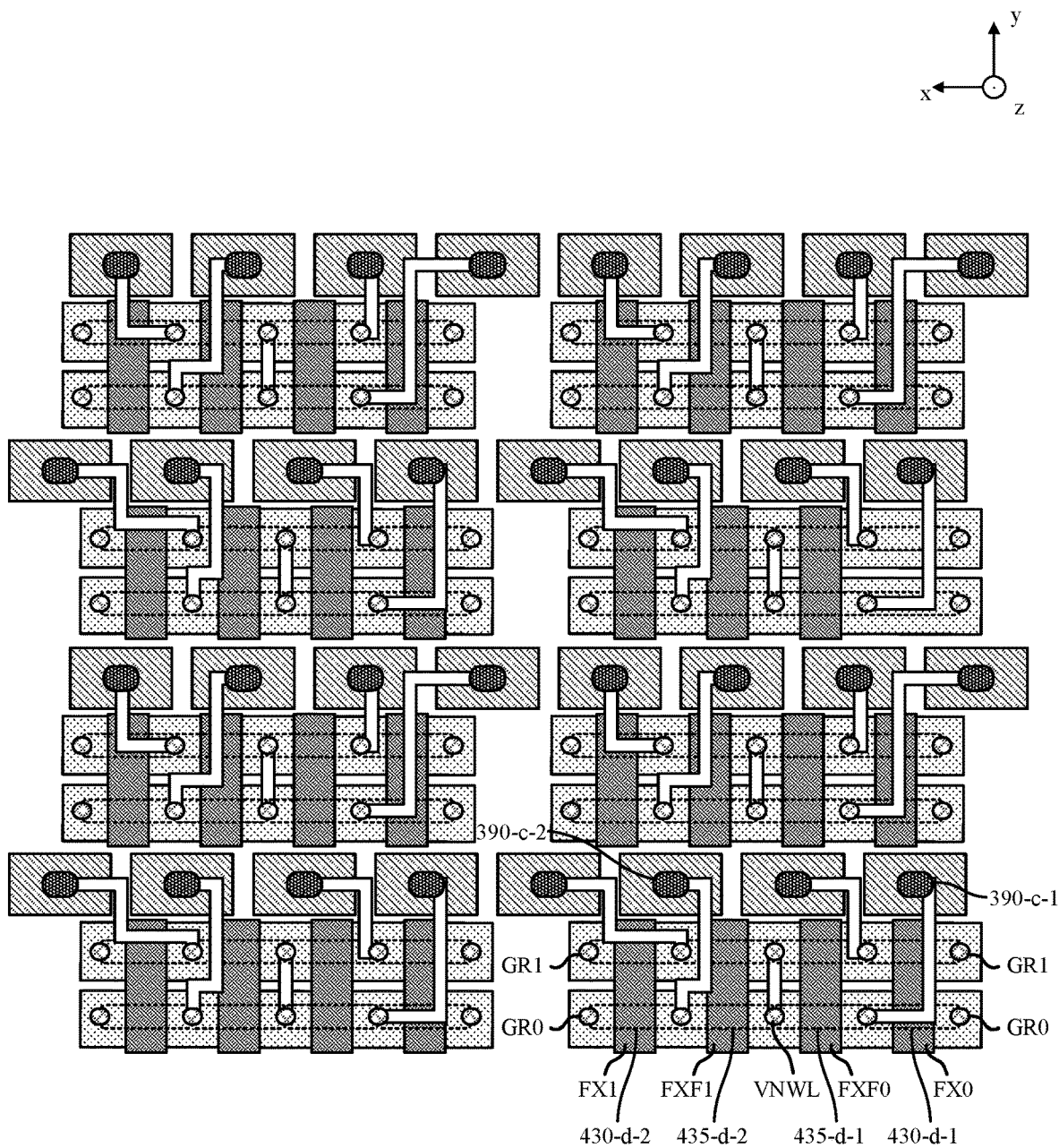

FIG. 7 illustrates an example of a material arrangement 700 that supports word line drivers for multiple-die memory devices in accordance with examples as disclosed herein. The material arrangement 700 illustrates material portions that may be implemented in a semiconductor die of a memory device, such as a semiconductor die 340. The material arrangement 700 is illustrated in a view along the z-direction, and illustrates material portions that may be located at various positions along the z-direction. For example, the material arrangement 700 illustrates transistors 430-*d* and 435-*d*, which may be associated with n-type transistor doped portions 520, gate portions 530, and terminal portions 540, as illustrated. The material arrangement 700 also illustrates electrical contacts 390-*c*, which may extend along the z-direction (e.g., through at least a portion of the semiconductor die associated with the material arrangement 600) and couple the transistors 430-*d* and 435-*d* with word line conductors 210 of another semiconductor die (e.g., a semiconductor die 310). Such a coupling may be provided via conductor portions 610, which may include one or more of a conductor portion 385, an electrical contact 380, a conductor portion 375, or an electrical contact 370, or any combination thereof. The word line conductors 210 of the other semiconductor die may extend along the x-direction or along the y-direction (e.g., relative to the material arrangement 700), such that the channels of the transistors 430-*d* and 435-*d* may each extend along a direction parallel to the word line conductors 210, or along a direction perpendicular to the word line conductors 210, among other relative directions. The electrical contacts 390-*d* may extend through window portions 620, each of which may be an example of a dielectric portion 346 described with reference to FIG. 3.

The material arrangement 700 illustrates an arrangement of material portions that may support decoding various quantities of word lines 110 of another semiconductor die. For example, to support accessing (e.g., selecting, biasing) a word line 110 via an electrical contact 390-*c*-1, the material arrangement 600 includes a transistor 430-*d*-1 and a transistor 435-*d*-1 (e.g., of a word line driver circuit 420 for the corresponding word line 110). The transistors of the word line driver circuit 420 associated with the electrical contact 390-*d*-1 may be coupled with various voltage sources and outputs of a word line decoder. For example, the transistor 430-*d*-1 may include a channel between a terminal portion 540 biased with the signal GR0 and a terminal portion 540 coupled with the electrical contact 390-*c*-1 (e.g., via the illustrated conductor portion 610), as well as a gate portion 530 operable to modulate a conductivity of the channel based on a biasing with the signal FX0. The transistor 435-*d*-1 may include a channel between a terminal portion 540 biased with the word line deselection voltage VNWL and a terminal portion 540 coupled with the electrical contact 390-*c*-1, as well as a gate portion 530 operable to modulate a conductivity of the channel based on a biasing with the signal FXF0. Such an arrangement may be functionally repeated for each of the other word lines 110 in accordance with the illustrated material portions, couplings, and biasing. For example, to support accessing (e.g., selecting, biasing) a word line associated with the electrical contact 390-*c*-2, the material arrangement 600 includes a transistor 430-*d*-2 and a transistor 435-*d*-2 (e.g., of a word line driver circuit 420 for the corresponding word line 110), and so on.

In some examples of the example of material arrangement 700, the signals GR # may be associated with decoding word line conductors 210 along the x-direction, or the y-direction, or both, and the signals FX # and FXF # may be associated with decoding word line conductors 210-*b* along the z-direction, among other decoding arrangements. Gate portions 530 may include contiguous portions of a gate material (e.g., along the y-direction) to form gates for transistors 430-*d* and transistors 435-*d* that are associated with different word lines 110 (e.g., in accordance with a common gate biasing with a signal, such as a common FX # signal or a common FXF # signal). Further, as illustrated in the example of material arrangement 700, n-type transistor doped portions 520 may include portions of the substrate 345 having a contiguous doping configuration (e.g., along the x-direction) to form channels for transistors 430-*d* and transistors 435-*d* that are associated with one or more word lines 110.

The material arrangement 700 illustrates an example of material portions that may be implemented to support groupings of a four word line pitch. For example, the electrical contacts 390-*c*, and related components (e.g., transistors 430, transistors 435), may include groups of four components that are repeated in sets that are aligned (e.g., in rows of such groups of four components) along the x-direction, and such sets at different locations along the y-direction may include groups, or components thereof, that are staggered in different positions along the x-direction, as shown. For example, electrical contacts 390-*b* and terminal portions 540 of a first row associated with a first location along the y-direction may be overlapping (e.g., aligned) along the y-direction. In some examples, electrical contacts 390-*b* and terminal portions 540 of a second row associated with a first location along the y-direction (e.g., adjacent to the first row) may also be overlapping (e.g., aligned) along the y-direction, but respective components of the second row may be associated with different positions along the direction than corresponding components of the first row. In some examples, such aspects of the material arrangement 700 may facilitate certain arrangements of material portions (e.g., word line conductors 210, conductor portions 335, electrical contacts 330, conductor portions 385, electrical contacts 380, electrical contacts 370, electrical contacts 390), certain word line decoding schemes (e.g., routing schemes for signals from a word line decoder), or both. Although certain quantities of respective components are shown in FIG. 6, such components may be repeated in different quantities along the x-direction, along the y-direction, or both to accommodate different arrangements, quantities, or decoding schemes of word lines 110 (e.g., arranged along the y-direction, arranged along the z-direction) in the associated memory device.

Material arrangements 500, 600, and 700 illustrate examples of implementing access line driver circuitry in a second semiconductor die (e.g., semiconductor die 340), different than a first semiconductor die (e.g., semiconductor die 310) that is associated with the access lines and corresponding memory cells. Implementing such access line driver circuitry may increase an area available for substrate-based circuitry (e.g., by implementing multiple substrates) compared to memory devices that include a single semiconductor die (e.g., a single semiconductor substrate, a single memory die). For example, such techniques may support leveraging substrate materials (e.g., of a substrate 345, of a substrate 315) for a greater quantity of components or larger components for circuitry such as the access line driver circuitry of the second semiconductor die, as well as other circuitry, such as other circuitry of a row decoder 120 (e.g., where applicable), of a column decoder 125, of a sense component 145, of an input/output 155, or of a local memory controller 160, which may be implemented on the first semiconductor die, on the second semiconductor die, or various combinations thereof. In some examples, implementing such circuitry in multiple levels of substrate-based circuitry of a memory device may alleviate or mitigate area utilization challenges or routing challenges of a single semiconductor substrate, which may improve scaling of a memory architecture by supporting a greater quantity of memory cells (e.g., a greater quantity of decks) for a given footprint, among other advantages.

Figure 8:
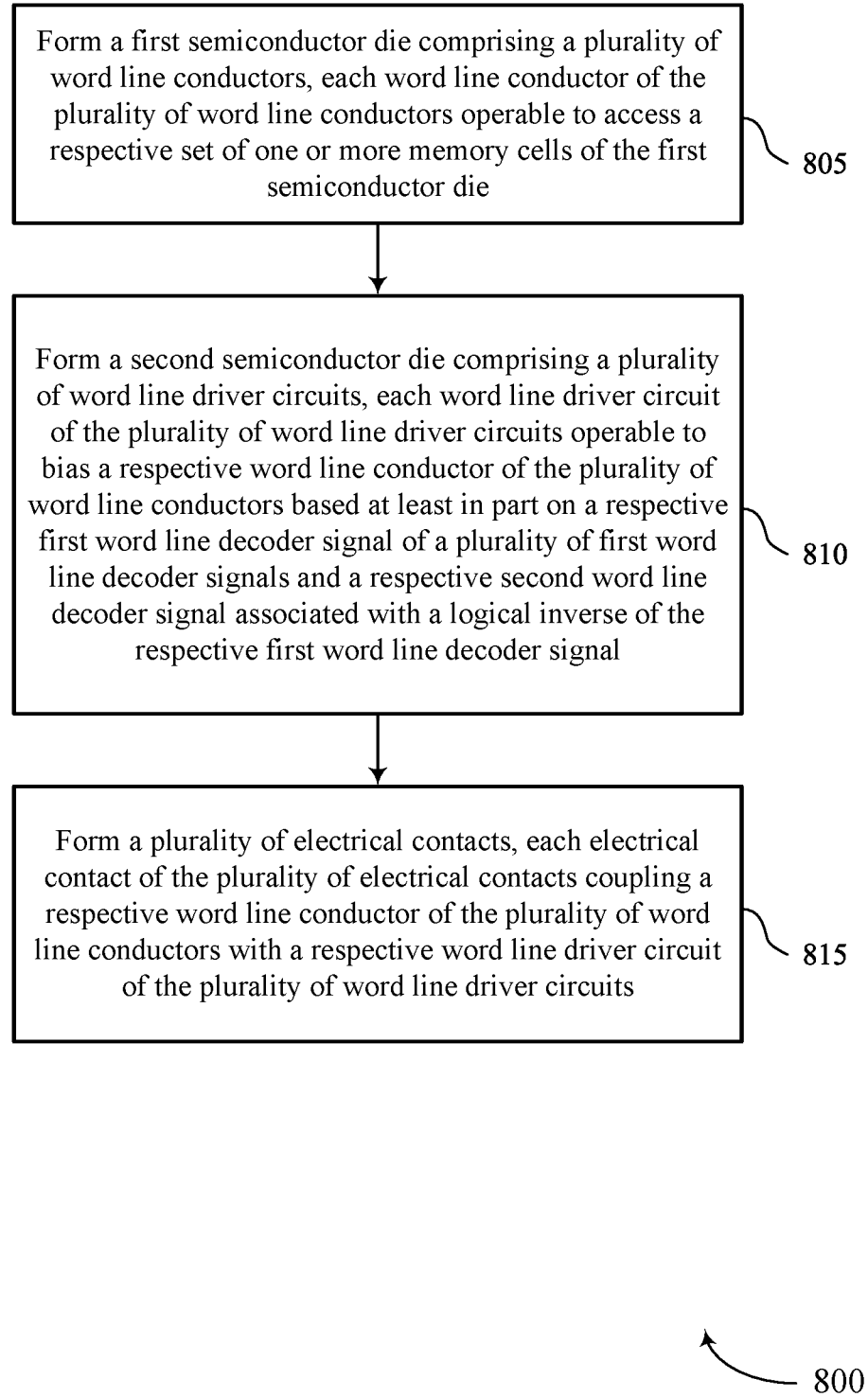

FIG. 8 shows a flowchart illustrating a method 800 that supports word line drivers for multiple-die memory devices in accordance with examples as disclosed herein. The operations of method 800 may be implemented by a manufacturing system or one or more controllers associated with a manufacturing system. In some examples, one or more controllers may execute a set of instructions to control one or more functional elements of the manufacturing system to perform the described functions. Additionally, or alternatively, the one or more controllers may perform aspects of the described functions using special-purpose hardware.

At 805, the method may include forming a first semiconductor die including a plurality of word line conductors, each word line conductor of the plurality of word line conductors operable to access a respective set of one or more memory cells of the first semiconductor die. The operations of 805 may be performed in accordance with examples as disclosed herein.

At 810, the method may include forming a second semiconductor die including a plurality of word line driver circuits, each word line driver circuit of the plurality of word line driver circuits operable to bias a respective word line conductor of the plurality of word line conductors based at least in part on a respective first word line decoder signal of a plurality of first word line decoder signals and a respective second word line decoder signal associated with a logical inverse of the respective first word line decoder signal. The operations of 810 may be performed in accordance with examples as disclosed herein.

At 815, the method may include forming a plurality of electrical contacts, each electrical contact of the plurality of electrical contacts coupling a respective word line conductor of the plurality of word line conductors with a respective word line driver circuit of the plurality of word line driver circuits. In some examples, each electrical contact of the plurality of electrical contacts may extend through at least a portion of the first semiconductor die, or may extend through at least a portion of the second semiconductor die, or both. The operations of 815 may be performed in accordance with examples as disclosed herein.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for forming a first semiconductor die including a plurality of word line conductors, each word line conductor of the plurality of word line conductors operable to access a respective set of one or more memory cells of the first semiconductor die; forming a second semiconductor die including a plurality of word line driver circuits, each word line driver circuit of the plurality of word line driver circuits operable to bias a respective word line conductor of the plurality of word line conductors based at least in part on a respective first word line decoder signal of a plurality of first word line decoder signals and a respective second word line decoder signal associated with a logical inverse of the respective first word line decoder signal; and forming a plurality of electrical contacts, each electrical contact of the plurality of electrical contacts coupling a respective word line conductor of the plurality of word line conductors with a respective word line driver circuit of the plurality of word line driver circuits.

Aspect 2: The method, apparatus, or non-transitory computer-readable medium of Aspects 1, where each electrical contact of the plurality of electrical contacts extends through at least a portion of the first semiconductor die, or extends through at least a portion of the second semiconductor die, or both.

Aspect 3: The method, apparatus, or non-transitory computer-readable medium of any of aspects 1 through 2, further including operations, features, circuitry, logic, means, or instructions, or any combination thereof for forming a plurality of cavities through the second semiconductor die and through at least a portion of the first semiconductor die, and forming the plurality of electrical contacts based at least in part on depositing a conductive material in the plurality of cavities.

Aspect 4: The method, apparatus, or non-transitory computer-readable medium of any of aspects 1 through 3, where forming each word line driver circuit of the plurality of word line driver circuits includes operations, features, circuitry, logic, means, or instructions, or any combination thereof for forming a first transistor having a first channel portion electrically coupled between a word line conductor of the plurality of word line conductors and word line selection voltage source, and having a first gate portion electrically coupled with an output of a word line decoder associated with the respective first word line decoder signal and forming a second transistor having a second channel portion electrically coupled between the word line conductor and word line deselection voltage source, and having a second gate portion electrically coupled with an output of the word line decoder associated with the respective second word line decoder signal.

Aspect 5: The method, apparatus, or non-transitory computer-readable medium of aspect 4, where forming the first channel portions and the second channel portions of the plurality of word line driver circuits includes doping a respective portion of a crystalline semiconductor of a substrate of the second semiconductor die.

Aspect 6: The method, apparatus, or non-transitory computer-readable medium of any of aspects 4 through 5, where, for a set of multiple word line driver circuits of the plurality of word line driver circuits, the respective first gate portions are formed from a contiguous first portion of a gate material, and the respective second gate portions are formed from a contiguous second portion of the gate material.

FIG. 9 shows a flowchart illustrating a method 900 that supports word line drivers for multiple-die memory devices in accordance with examples as disclosed herein. The operations of method 900 may be implemented by a manufacturing system or one or more controllers associated with a manufacturing system. In some examples, one or more controllers may execute a set of instructions to control one or more functional elements of the manufacturing system to perform the described functions. Additionally, or alternatively, the one or more controllers may perform aspects of the described functions using special-purpose hardware.

At 905, the method may include accessing a set of one or more memory cells of a first semiconductor die based at least in part on biasing a word line conductor of the first semiconductor die. In some examples, biasing the word line conductor may include activating a first channel of a first transistor of a second semiconductor die, the first channel electrically coupled between the word line conductor and a word line selection voltage source of the second semiconductor die. In some examples, biasing the word line conductor may include deactivating a second channel of a second transistor of the second semiconductor die, the second channel electrically coupled between the word line conductor and a word line deselection voltage source of the second semiconductor die. The operations of 905 may be performed in accordance with examples as disclosed herein.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 7: A method, apparatus, or non-transitory computer-readable medium including operations, features, circuitry, logic, means, or instructions, or any combination thereof for accessing a set of one or more memory cells of a first semiconductor die based at least in part on biasing a word line conductor of the first semiconductor die, where biasing the word line conductor includes: activating a first channel of a first transistor of a second semiconductor die, the first channel electrically coupled between the word line conductor and a word line selection voltage source of the second semiconductor die; and deactivating a second channel of a second transistor of the second semiconductor die, the second channel electrically coupled between the word line conductor and a word line deselection voltage source of the second semiconductor die.

Aspect 8: The method, apparatus, or non-transitory computer-readable medium of aspect 7, where biasing the word line conductor includes operations, features, circuitry, logic, means, or instructions, or any combination thereof for biasing the word line conductor via an electrical contact that extends through at least a portion of the first semiconductor die, or extends through at least a portion of the second semiconductor die, or both.

Aspect 9: The method, apparatus, or non-transitory computer-readable medium of any of aspects 7 through 8, where activating the first channel is based at least in part on applying a first word line decoder signal to a first gate of the first transistor and deactivating the second channel is based at least in part on applying a second word line decoder signal, associated with a logical inverse of the first word line decoder signal, to a second gate of the second transistor.

Aspect 10: The method, apparatus, or non-transitory computer-readable medium of aspect 9, further including operations, features, circuitry, logic, means, or instructions, or any combination thereof for outputting, by the word line selection voltage source, a decoded word line selection voltage to the first channel, where biasing the word line conductor is based at least in part on the decoded word line selection voltage.

Aspect 11: The method, apparatus, or non-transitory computer-readable medium of aspect 10, further including operations, features, circuitry, logic, means, or instructions, or any combination thereof for deselecting a second set of one or more memory cells of the first semiconductor die based at least in part on biasing a second word line conductor of the first semiconductor die, where biasing the second word line conductor includes: activating a third channel of a third transistor of the second semiconductor die based at least in part on applying the first word line decoder signal to a third gate of the third transistor, the third channel electrically coupled between the second word line conductor and the word line selection voltage source; deactivating a fourth channel of a fourth transistor of the second semiconductor die based at least in part on applying the second word line decoder signal to a fourth gate of the fourth transistor, the fourth channel electrically coupled between the second word line conductor and the word line deselection voltage source; and outputting, by the word line selection voltage source, a decoded word line deselection voltage to the third channel.

Aspect 12: The method, apparatus, or non-transitory computer-readable medium of any of aspects 10 through 11, further including operations, features, circuitry, logic, means, or instructions, or any combination thereof for deselecting a third set of one or more memory cells of the first semiconductor die based at least in part on biasing a third word line conductor of the first semiconductor die, where biasing the third word line conductor includes: deactivating a fifth channel of a fifth transistor of the second semiconductor die, the fifth channel electrically coupled between the third word line conductor and the word line selection voltage source; and activating a sixth channel of a sixth transistor of the second semiconductor die, the sixth channel electrically coupled between the third word line conductor and the word line deselection voltage source.

Aspect 13: The method, apparatus, or non-transitory computer-readable medium of aspect 12, further including operations, features, circuitry, logic, means, or instructions, or any combination thereof for outputting, by the word line selection voltage source, the decoded word line selection voltage to the fifth channel.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 14: An apparatus including: a first semiconductor die including a plurality of word line conductors, each word line conductor of the plurality of word line conductors operable to access a respective set of one or more memory cells of the first semiconductor die; a second semiconductor die including a plurality of word line driver circuits, each word line driver circuit of the plurality of word line driver circuits operable to bias a respective word line conductor of the plurality of word line conductors based at least in part on a respective first word line decoder signal of a plurality of first word line decoder signals and a respective second word line decoder signal associated with a logical inverse of the respective first word line decoder signal; and a plurality of electrical contacts, each electrical contact of the plurality of electrical contacts extending through at least a portion of the first semiconductor die, extending through at least a portion of the second semiconductor die, and coupling a respective word line conductor of the plurality of word line conductors with a respective word line driver circuit of the plurality of word line driver circuits.

Aspect 15: The apparatus of aspect 14, where each electrical contact of the plurality of electrical contacts extends through a crystalline substrate of the second semiconductor die.

Aspect 16: The apparatus of any of aspects 14 through 15, where each word line driver circuit of the plurality of word line driver circuits includes: a first transistor having a first channel portion electrically coupled between a word line conductor of the plurality of word line conductors and word line selection voltage source, and having a first gate portion electrically coupled with an output of a word line decoder associated with the respective first word line decoder signal; and a second transistor having a second channel portion electrically coupled between the word line conductor and word line deselection voltage source, and having a second gate portion electrically coupled with an output of the word line decoder associated with the respective second word line decoder signal.

Aspect 17: The apparatus of aspect 16, where the word line selection voltage source outputs a word line selection voltage that is decoded for respective subsets of the plurality of word line conductors.

Aspect 18: The apparatus of aspect 17, where the second semiconductor die includes a word line decoder operable to output the plurality of first word line decoder signals and the decoded word line selection voltage.

Aspect 19: The apparatus of any of aspects 16 through 18, where: each word line conductor of the plurality of word line conductors extends along a direction over a substrate of the first semiconductor die; and each first channel portion and each second channel portion is associated with a channel along the direction.

Aspect 20: The apparatus of any of aspects 16 through 19, where: each word line conductor of the plurality of word line conductors extends along a first direction over a substrate of the first semiconductor die; and each first channel portion and each second channel portion is associated with a channel along a second direction different than the first direction.

Aspect 21: The apparatus of any of aspects 16 through 20, where the first channel portions and the second channel portions each include a respective doped portion of a crystalline substrate of the second semiconductor die.

Aspect 22: The apparatus of any of aspects 16 through 21, where the first channel portions and the second channel portions of the plurality of word line driver circuits are associated with a same transistor channel type.

Aspect 23: The apparatus of any of aspects 16 through 22, where, for each word line driver circuit of the plurality of word line driver circuits, the first gate portion and the second gate portion have respective extents along a direction away from a substrate of the second semiconductor die that are at least partially overlapping.

Aspect 24: The apparatus of any of aspects 16 through 23, where, for a set of multiple word line driver circuits of the plurality of word line driver circuits, the respective first gate portions are formed from a contiguous first portion of a gate material, and the respective second gate portions are formed from a contiguous second portion of the gate material.

Aspect 25: The apparatus of aspect 24, where two or more of the word line conductors corresponding to the set of multiple word line driver circuits have different locations along a direction away from a substrate of the first semiconductor die.

Aspect 26: The apparatus of any of aspects 24 through 25, where two or more of the word line conductors corresponding to the set of multiple word line driver circuits have different locations along a direction over a substrate of the first semiconductor die.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors or gates (e.g., gate portion 368).

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The terms "layer" and "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

As used herein, the terms "electrical contact," "conductive pillar," and "electrical coupling," may refer to an electrical conductor, and in some examples, may be employed as an electrical contact to a memory cell or other component of a memory array. An electrical contact, conductive pillar, and electrical coupling may include a trace, a wire, a conductive line, a conductive layer, or the like that provides a conductive path between components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus comprising:
a first semiconductor die comprising a plurality of word line conductors, each word line conductor of the plurality of word line conductors operable to access a respective set of one or more memory cells of the first semiconductor die;
a second semiconductor die comprising a plurality of word line driver circuits, each word line driver circuit of the plurality of word line driver circuits operable to bias a respective word line conductor of the plurality of word line conductors based at least in part on a respective first word line decoder signal of a plurality of first word line decoder signals and a respective second word line decoder signal associated with a logical inverse of the respective first word line decoder signal; and
a plurality of electrical contacts, each electrical contact of the plurality of electrical contacts extending through at least a portion of the second semiconductor die and coupling a respective word line conductor of the plurality of word line conductors with a respective word line driver circuit of the plurality of word line driver circuits.

2. The apparatus of claim 1, wherein each electrical contact of the plurality of electrical contacts extends through a crystalline substrate of the second semiconductor die.

3. The apparatus of claim 1, wherein each word line driver circuit of the plurality of word line driver circuits comprises:
a first transistor having a first channel portion electrically coupled between a word line conductor of the plurality of word line conductors and word line selection voltage source, and having a first gate portion electrically coupled with an output of a word line decoder associated with the respective first word line decoder signal; and
a second transistor having a second channel portion electrically coupled between the word line conductor and word line deselection voltage source, and having a second gate portion electrically coupled with an output of the word line decoder associated with the respective second word line decoder signal.

4. The apparatus of claim 3, wherein the word line selection voltage source outputs a word line selection voltage that is decoded for respective subsets of the plurality of word line conductors.

5. The apparatus of claim 4, wherein the second semiconductor die comprises a word line decoder operable to output the plurality of first word line decoder signals and the decoded word line selection voltage.

6. The apparatus of claim 3, wherein:
each word line conductor of the plurality of word line conductors extends along a direction over a substrate of the first semiconductor die; and
each first channel portion and each second channel portion is associated with a channel along the direction.

7. The apparatus of claim 3, wherein:
each word line conductor of the plurality of word line conductors extends along a first direction over a substrate of the first semiconductor die; and
each first channel portion and each second channel portion is associated with a channel along a second direction different than the first direction.

8. The apparatus of claim 3, wherein the first channel portions and the second channel portions each comprise a respective doped portion of a crystalline substrate of the second semiconductor die.

9. The apparatus of claim 3, wherein the first channel portions and the second channel portions of the plurality of word line driver circuits are associated with a same transistor channel type.

10. The apparatus of claim 3, wherein, for each word line driver circuit of the plurality of word line driver circuits, the first gate portion and the second gate portion have respective extents along a direction away from a substrate of the second semiconductor die that are at least partially overlapping.

11. The apparatus of claim 3, wherein, for a set of multiple word line driver circuits of the plurality of word line driver circuits, the respective first gate portions are formed from a contiguous first portion of a gate material, and the respective second gate portions are formed from a contiguous second portion of the gate material.

12. The apparatus of claim 11, wherein two or more of the word line conductors corresponding to the set of multiple word line driver circuits have different locations along a direction away from a substrate of the first semiconductor die.

13. The apparatus of claim 11, wherein two or more of the word line conductors corresponding to the set of multiple word line driver circuits have different locations along a direction over a substrate of the first semiconductor die.

14. A method, comprising:
forming a first semiconductor die comprising a plurality of word line conductors, each word line conductor of the plurality of word line conductors operable to access a respective set of one or more memory cells of the first semiconductor die;
forming a second semiconductor die comprising a plurality of word line driver circuits, each word line driver circuit of the plurality of word line driver circuits operable to bias a respective word line conductor of the plurality of word line conductors based at least in part on a respective first word line decoder signal of a plurality of first word line decoder signals and a respective second word line decoder signal associated with a logical inverse of the respective first word line decoder signal; and
forming a plurality of electrical contacts, each electrical contact of the plurality of electrical contacts extending through at least a portion of the second semiconductor die and coupling a respective word line conductor of the plurality of word line conductors with a respective word line driver circuit of the plurality of word line driver circuits.

15. The method of claim 14, further comprising:
forming a plurality of cavities through the second semiconductor die; and
forming the plurality of electrical contacts based at least in part on depositing a conductive material in the plurality of cavities.

16. The method of claim 14, wherein forming each word line driver circuit of the plurality of word line driver circuits comprises:
forming a first transistor having a first channel portion electrically coupled between a word line conductor of the plurality of word line conductors and word line selection voltage source, and having a first gate portion electrically coupled with an output of a word line decoder associated with the respective first word line decoder signal; and
forming a second transistor having a second channel portion electrically coupled between the word line conductor and word line deselection voltage source, and having a second gate portion electrically coupled with an output of the word line decoder associated with the respective second word line decoder signal.

17. The method of claim 16, wherein forming the first channel portions and the second channel portions of the plurality of word line driver circuits comprises doping a respective portion of a crystalline semiconductor of a substrate of the second semiconductor die.

18. The method of claim 16, wherein, for a set of multiple word line driver circuits of the plurality of word line driver circuits, the respective first gate portions are formed from a contiguous first portion of a gate material, and the respective second gate portions are formed from a contiguous second portion of the gate material.

19. A method comprising:
accessing a set of one or more memory cells of a first semiconductor die based at least in part on biasing a word line conductor of the first semiconductor die, wherein biasing the word line conductor comprises:
  activating a first channel of a first transistor of a second semiconductor die, the first channel electrically coupled between the word line conductor and a word line selection voltage source of the second semiconductor die; and
  deactivating a second channel of a second transistor of the second semiconductor die, the second channel electrically coupled between the word line conductor and a word line deselection voltage source of the second semiconductor die.

20. The method of claim 19, wherein biasing the word line conductor comprises:
biasing the word line conductor via an electrical contact that extends through at least a portion of the second semiconductor die.

21. The method of claim 19, wherein:
activating the first channel is based at least in part on applying a first word line decoder signal to a first gate of the first transistor; and
deactivating the second channel is based at least in part on applying a second word line decoder signal, associated with a logical inverse of the first word line decoder signal, to a second gate of the second transistor.

22. The method of claim 21, further comprising:
outputting, by the word line selection voltage source, a decoded word line selection voltage to the first channel, wherein biasing the word line conductor is based at least in part on the decoded word line selection voltage.

23. The method of claim 22, further comprising:
deselecting a second set of one or more memory cells of the first semiconductor die based at least in part on biasing a second word line conductor of the first semiconductor die, wherein biasing the second word line conductor comprises:
  activating a third channel of a third transistor of the second semiconductor die based at least in part on applying the first word line decoder signal to a third gate of the third transistor, the third channel electrically coupled between the second word line conductor and the word line selection voltage source;
  deactivating a fourth channel of a fourth transistor of the second semiconductor die based at least in part on applying the second word line decoder signal to a fourth gate of the fourth transistor, the fourth channel electrically coupled between the second word line conductor and the word line deselection voltage source; and
  outputting, by the word line selection voltage source, a decoded word line deselection voltage to the third channel.

24. The method of claim 22, further comprising:
deselecting a third set of one or more memory cells of the first semiconductor die based at least in part on biasing a third word line conductor of the first semiconductor die, wherein biasing the third word line conductor comprises:
  deactivating a fifth channel of a fifth transistor of the second semiconductor die, the fifth channel electrically coupled between the third word line conductor and the word line selection voltage source; and
  activating a sixth channel of a sixth transistor of the second semiconductor die, the sixth channel electrically coupled between the third word line conductor and the word line deselection voltage source.

25. The method of claim 24, further comprising:
outputting, by the word line selection voltage source, the decoded word line selection voltage to the fifth channel.

* * * * *